(12) United States Patent
Won et al.

(10) Patent No.: US 11,862,088 B2
(45) Date of Patent: Jan. 2, 2024

(54) DISPLAY DEVICE

(71) Applicant: Samsung Display Co., LTD., Yongin-si (KR)

(72) Inventors: Byeong Hee Won, Incheon (KR); Seong Won Kim, Asan-si (KR); In Seon Yoon, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/951,100

(22) Filed: Sep. 23, 2022

(65) Prior Publication Data

US 2023/0110048 A1    Apr. 13, 2023

(30) Foreign Application Priority Data

Sep. 24, 2021  (KR) .................. 10-2021-0126048

(51) Int. Cl.
*G09G 3/3233* (2016.01)
*G09G 3/3266* (2016.01)
*H10K 59/131* (2023.01)
*H10K 59/88* (2023.01)

(52) U.S. Cl.
CPC ......... *G09G 3/3233* (2013.01); *G09G 3/3266* (2013.01); *H10K 59/131* (2023.02); *G09G 2300/0413* (2013.01); *G09G 2300/0426* (2013.01); *G09G 2300/0819* (2013.01); *G09G 2300/0842* (2013.01); *H10K 59/88* (2023.02)

(58) Field of Classification Search
CPC ............... G09G 3/3233; G09G 3/3266; G09G 2300/0413; G09G 2300/0426; G09G 2300/0819; G09G 2300/0842; G09G 3/035; G09G 2310/0251; G09G 2310/0262; H10K 59/131; H10K 59/88
See application file for complete search history.

(56) References Cited

U.S. PATENT DOCUMENTS

| | | | |
|---|---|---|---|
| 10,727,281 B2 * | 7/2020 | Choi | G09G 3/3258 |
| 2014/0319528 A1 * | 10/2014 | Kesho | H10K 59/131 |
| | | | 257/59 |
| 2015/0279271 A1 * | 10/2015 | Xi | H10K 59/131 |
| | | | 345/76 |
| 2021/0157449 A1 * | 5/2021 | Lee | G06F 3/0412 |
| 2021/0241696 A1 * | 8/2021 | Cho | G09G 3/3291 |
| 2022/0262874 A1 * | 8/2022 | Shin | H10K 77/111 |
| 2022/0320196 A1 * | 10/2022 | He | G09G 3/3233 |

FOREIGN PATENT DOCUMENTS

| | | |
|---|---|---|
| KR | 102043852 | 11/2019 |
| KR | 1020200017336 | 2/2020 |

* cited by examiner

*Primary Examiner* — Dmitriy Bolotin
(74) *Attorney, Agent, or Firm* — CANTOR COLBURN LLP

(57) ABSTRACT

A display device includes a display area, and a dummy area disposed on one side of the display area, where each of the display area and the dummy area includes a first island pattern and a second island pattern disposed to be spaced apart from each other, and a connection pattern connecting the first island pattern and the second island pattern to each other, and the dummy area includes a dummy common electrode and a common connection electrode electrically connected to the dummy common electrode, which are disposed in each of the first island pattern and the second island pattern thereof.

20 Claims, 27 Drawing Sheets

DISPLAY DEVICE

This application claims priority to Korean Patent Application No. 10-2021-0126048, filed on Sep. 24, 2021, and all the benefits accruing therefrom under 35 U.S.C. 119, the content of which in its entirety is herein incorporated by reference.

BACKGROUND

1. Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions.

The display device may be a flat panel display device such as a liquid crystal display device, a field emission display device, or a light emitting display device. The light emitting display device may include an organic light emitting display device including an organic light emitting element, an inorganic light emitting display device including an inorganic light emitting element such as an inorganic semiconductor, or a micro light emitting display device including a micro light emitting element. Recently, the light emitting display device has been developed as a stretchable display device that may be stretched vertically and/or horizontally.

SUMMARY

Embodiments of the disclosure provide a display device in which a width of a non-display area of a display panel is decreased.

According to an embodiment of the disclosure, a display device includes a display area, and a dummy area disposed on one side of the display area, wherein each of the display area and the dummy area includes a first island pattern and a second island pattern disposed to be spaced apart from each other, and a connection pattern connecting the first island pattern and the second island pattern to each other, and the dummy area includes a dummy common electrode and a common connection electrode electrically connected to the dummy common electrode, which are disposed in each of the first island pattern and the second island pattern thereof.

In an embodiment, the display area may include a light emitting element disposed in each of the first island pattern and the second island pattern thereof, where the light emitting element may include a pixel electrode, a display emission layer disposed on the pixel electrode, and an island common electrode disposed on the display emission layer.

In an embodiment, the dummy area may include a dummy emission layer disposed in each of the first island pattern and the second island pattern thereof, where the dummy emission layer may include a same material as the display emission layer.

In an embodiment, the island common electrode may be connected to the common connection electrode through a common contact hole defined through an insulating layer interposed between the island common electrode and the common connection electrode.

In an embodiment, the common contact hole may not overlap the dummy emission layer.

In an embodiment, the dummy area may include a first power line disposed in each of the first island pattern and the second island pattern thereof, where a first power voltage may be applied to the first power line and the first power line may be connected to the common connection electrode.

In an embodiment, the first power line may be disposed in a same layer as the common connection electrode, and the first power line and the common connection electrode include the same material.

In an embodiment, the first power line may overlap the dummy emission layer.

In an embodiment, the first power line may include a first sub-power line and a second sub-power line overlapping each other.

In an embodiment, the first sub-power line may be disposed in a same layer as the common connection electrode, and the first sub-power line and the common connection electrode include the same material.

In an embodiment, the first sub-power line may be disposed on the first island pattern, the second island pattern, and the connection pattern in the dummy area, and the second sub-power line may be disposed on the first island pattern and the second island pattern.

In an embodiment, the display area may further include a pixel driver which drives the light emitting element, and the pixel driver may include a driving transistor, a first transistor which initializes a gate electrode of the driving transistor to an initialization voltage of an initialization voltage line in response to a scan initialization signal of a scan initialization line, a second transistor which applies a data voltage to the gate electrode of the driving transistor in response to a scan write signal of a scan write line, and a third transistor which connects a first electrode of the driving transistor to the pixel electrode in response to an emission signal of an emission line.

In an embodiment, in each of the first island pattern and the second island pattern of the dummy area, the scan initialization line, the scan write line, and the emission line may cross the first power line.

In an embodiment, the scan initialization line, the scan write line, and the emission line may overlap the dummy emission layer.

According to an embodiment of the disclosure, a display device includes a display area, and a dummy area disposed on one side of the display area, where each of the display area and the dummy area includes a first island pattern and a second island pattern disposed to be spaced apart from each other, and a connection pattern connecting the first island pattern and the second island pattern to each other, the display area includes a light emitting element disposed in each of the first island pattern and the second island pattern thereof, where the light emitting element includes a pixel electrode, a display emission layer disposed on the pixel electrode, and an island common electrode disposed on the display emission layer, the dummy area includes a dummy emission layer disposed in each of the first island pattern and the second island pattern thereof, where the dummy emission layer includes including a same material as the display emission layer, and the connection pattern is bent or unbent.

In an embodiment, the dummy area may include a first power line disposed in each of the first island pattern and the second island pattern thereof, where a first power voltage may be applied to the first power line.

In an embodiment, the dummy area may further include a first power connection line connected to the first power line, and the first power connection line may include a first sub-power connection line disposed on the connection pattern, and a second sub-power connection line disposed on the first island pattern, and the first sub-power connection line may be connected to the second sub-power connection line through a first contact hole defined through an insulating layer interposed between the first sub-power connection line and the second sub-power connection line.

In an embodiment, the second sub-power connection line may overlap the dummy emission layer.

In an embodiment, the first power connection line may further include a third sub-power connection line disposed on the first island pattern, and the first sub-power connection line may be connected to the third sub-power connection line through a second contact hole defined through an insulating layer interposed between the first sub-power connection line and the third sub-power connection line.

According to an embodiment of the disclosure, a display device includes a display area including display pixels, a scan driver which outputs scan signals to scan lines connected to the display pixels, and a dummy area disposed between the display area and the scan driver, where each of the display area, the dummy area, and the scan driver includes a first island pattern and a second island pattern disposed to be spaced apart from each other, and a connection pattern connecting the first island pattern and the second island pattern to each other, and the scan driver includes a plurality of scan transistors disposed in each of the first island pattern and the second island pattern thereof.

In embodiments of the display device according to the invention, the first power line is not disposed at an edge of the display panel, but may be disposed in the dummy area in which the dummy emission layers are disposed. In such embodiments, the first power line may be disposed to overlap the dummy emission layer in the dummy area. Therefore, first power lines disposed on the left side of the first scan driver and on the right side of the second scan driver may be omitted, and thus, a width of the non-display area may be decreased.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
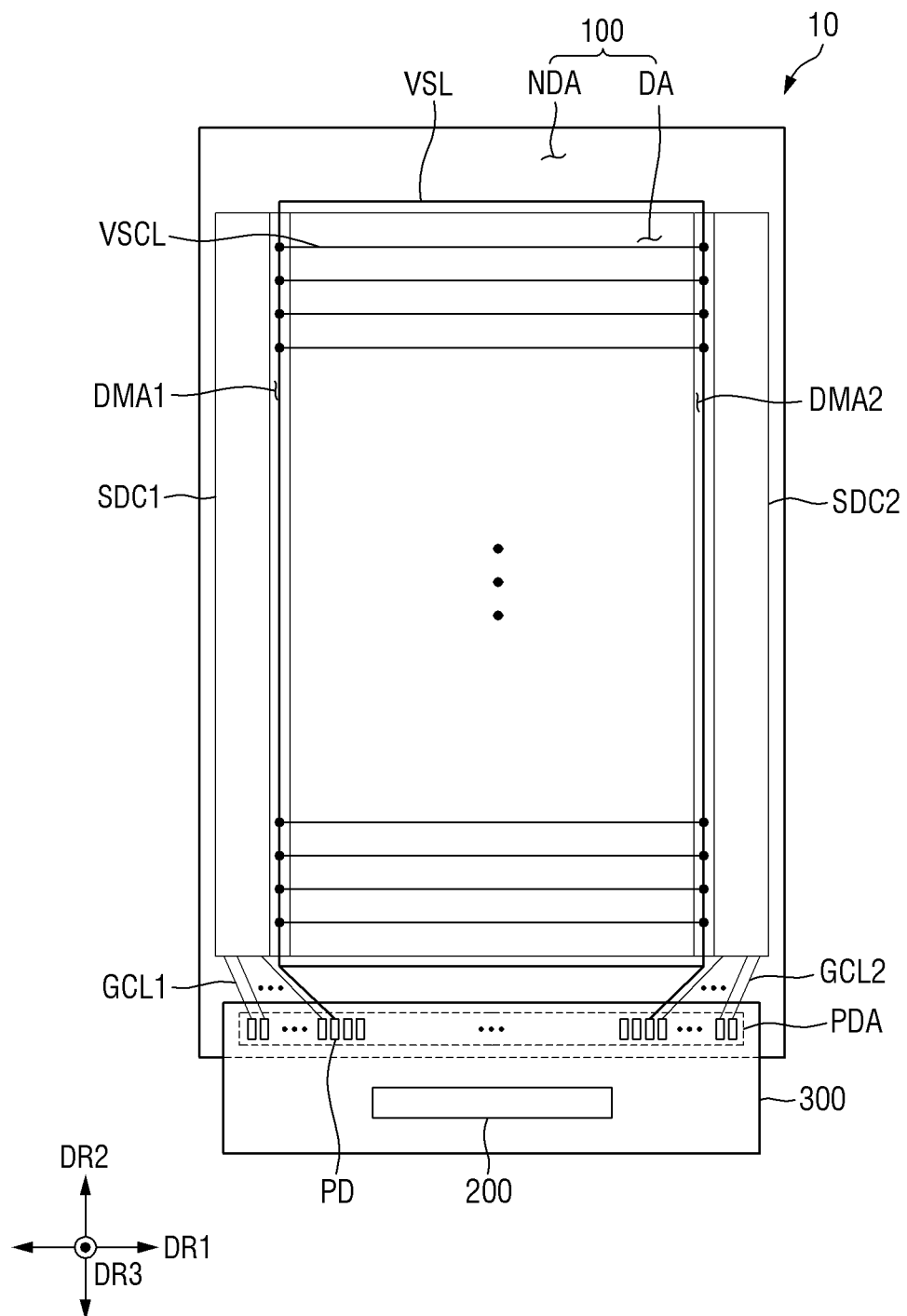
FIG. 1 is a plan view illustrating a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a plan view illustrating a display device according to an embodiment.

Referring to FIG. 1, a display device 10 is a device that displays a moving image or a still image, and may be used as or define a display screen of each of various products such as televisions, laptop computers, monitors, billboards, and Internet of Things ("IOT") devices as well as portable electronic devices such as mobile phones, smartphones, tablet personal computers ("PC"s), smart watches, watch phones, mobile communication terminals, electronic notebooks, electronic books, portable multimedia players ("PMP"s), navigation devices, and ultra mobile PCs ("UMPC"s).

An embodiment of the display device 10 may be a light emitting display device such as an organic light emitting display device using an organic light emitting diode, a quantum dot light emitting display device including a quantum dot light emitting layer, an inorganic light emitting display device including an inorganic semiconductor, or a micro light emitting display device using a micro or nano light emitting diode (micro LED or nano LED). Hereinafter, for convenience of description, embodiments where the display device 10 is the organic light emitting display device will be described in detail, but the disclosure is not limited thereto.

In an embodiment, the display device 10 includes a display panel 100, a display driving circuit 200, and a circuit board 300.

The display panel 100 may be in a rectangular shape, in a plan view, having short sides in a first direction DR1 and long sides in a second direction DR2 crossing the first direction DR1. A corner where the short side in the first direction DR1 and the long side in the second direction DR2 meet may be right-angled or rounded with a predetermined curvature. The shape of the display panel 100 in a plan view is not limited to the rectangular shape, and may be a polygonal shape, a circular shape, or an elliptical shape. The display panel 100 may be flat, but is not limited thereto. In an embodiment, for example, the display panel 100 may include curved surface parts formed at left and right distal ends thereof and having a constant curvature or a variable curvature. In an embodiment, the display panel 100 may be flexible or flexibly formed to be bent, folded, or rolled.

The display panel 100 may include a display area DA that displays an image and a non-display area NDA that does not display an image.

The display area DA may include display pixels SPX (see FIG. 2) that display the image. The display area DA may occupy most of an area of the display panel 100. The display area DA may be disposed at a center of the display panel 100.

The non-display area NDA may be disposed adjacent to the display area DA. The non-display area NDA may be disposed to surround the display area DA. The non-display area NDA may be an edge area of the display panel 100.

The non-display area NDA may include a first dummy area DMA1, a second dummy area DMA2, a first scan driver SDC1, a second scan driver SDC2, and a pad area PDA.

The first dummy area DMA1 may be disposed on one side (e.g., the left side) of the display area DA, and the second dummy area DMA2 may be disposed on another side (e.g., an opposing side or the right side) of the display area DA. The first dummy area DMA1 and the second dummy area DMA2 may be areas defined or designed in consideration of a deposition quality of display emission layers of display pixels SPX (see FIG. 2) disposed at edges of a fine metal mask when the display emission layers of the display pixels SPX (see FIG. 2) of the display area DA are formed using the fine metal mask. Therefore, dummy emission layers DEL including substantially a same material as the display emission layers of the display pixels SPX (see FIG. 2) may be disposed in the first dummy area DMA1 and the second dummy area DMA2.

The first scan driver SDC1 may be disposed adjacent to the first dummy area DMA1. In an embodiment, for example, the first scan driver SDC1 may be disposed on the left side of the first dummy area DMA1.

The second scan driver SDC2 may be disposed adjacent to the second dummy area DMA2. In an embodiment, for example, the second scan driver SDC2 may be disposed on the right side of the second dummy area DMA2.

Each of the first scan driver SDC1 and the second scan driver SDC2 may include a scan signal output unit connected to scan lines of the display area DA. The scan lines may include scan write lines GWLk (see FIG. 2) and scan initialization lines GILk (see FIG. 2). Each of the first scan driver SDC1 and the second scan driver SDC2 may further include an emission signal output unit connected to emission lines EMLk (see FIG. 2) of the display area DA.

The first scan driver SDC1 may be connected to display pads PD of the pad area PDA through first scan control lines GCL1. The second scan driver SDC2 may be connected to the display pads PD of the pad area PDA through second scan control lines GCL2. Accordingly, each of the first scan driver SDC1 and the second scan driver SDC2 may be electrically connected to the display driving circuit 200 through the display pads PD of the pad area PDA and the circuit board 300.

The scan signal output unit of each of the first scan driver SDC1 and the second scan driver SDC2 may receive scan control signals from the display driving circuit 200, generate scan signals based on the scan control signals, and output the scan signals to the scan lines. In addition, the emission signal output unit of each of the first scan driver SDC1 and the second scan driver SDC2 may receive emission control signals from the display driving circuit 200, generate emission signals based on the emission control signals, and output the emission signals to the emission lines.

A first power line VSL may be disposed in the non-display area NDA. The first power line VSL may be disposed to surround the display area DA. The first power line VSL may be disposed on the lower side and the upper side of the display area DA, in the first dummy area DMA1, and in the second dummy area DMA2. The first power line VSL may be connected to the display pads PD of the pad area PDA. That is, the first power line VSL may be electrically connected to the circuit board 300 through the display pads PD of the pad area PDA. Therefore, the first power line VSL may receive a first power voltage from the circuit board 300.

First power connection lines VSCL may be disposed in the display area DA, the first dummy area DMA1, and the second dummy area DMA2. The first power connection lines VSCL may extend in the first direction DR1. The first power connection lines VSCL may be connected to the first power line VSL in each of the first dummy area DMA1 and the second dummy area DMA2. Accordingly, the first power voltage of the first power line VSL may be supplied to the first power connection lines VSCL.

The pad area PDA may be disposed on one side (e.g., the lower side) of the display panel 100. The pad area PDA may include a plurality of display pads PD.

The display driving circuit 200 may generate signals and voltages for driving the display panel 100. The display driving circuit 200 may be formed as an integrated circuit ("IC") and attached onto the circuit board 300 in a chip on film ("COF") manner.

The circuit board 300 may be attached to the pad area PDA disposed at one end of the display panel 100. Accordingly, the circuit board 300 may be electrically connected to the display panel 100. The display panel 100 may receive power voltages through the circuit board 300, and may receive the scan control signals and data voltages of the display driving circuit 200. The circuit board 300 may be a flexible film such as a chip on film.

In an embodiment, as illustrated in FIG. 1, the first power line VSL is not disposed at edges of the display panel 100, but may be disposed in the first dummy area DMA1 and the second dummy area DMA2 in which the dummy emission layers DEL are disposed. Therefore, in such an embodiment, first power lines disposed on the left side of the first scan driver SDC1 and on the right side of the second scan driver SDC2 may be omitted, and thus, a width of the non-display area may be decreased.

Figure 2:
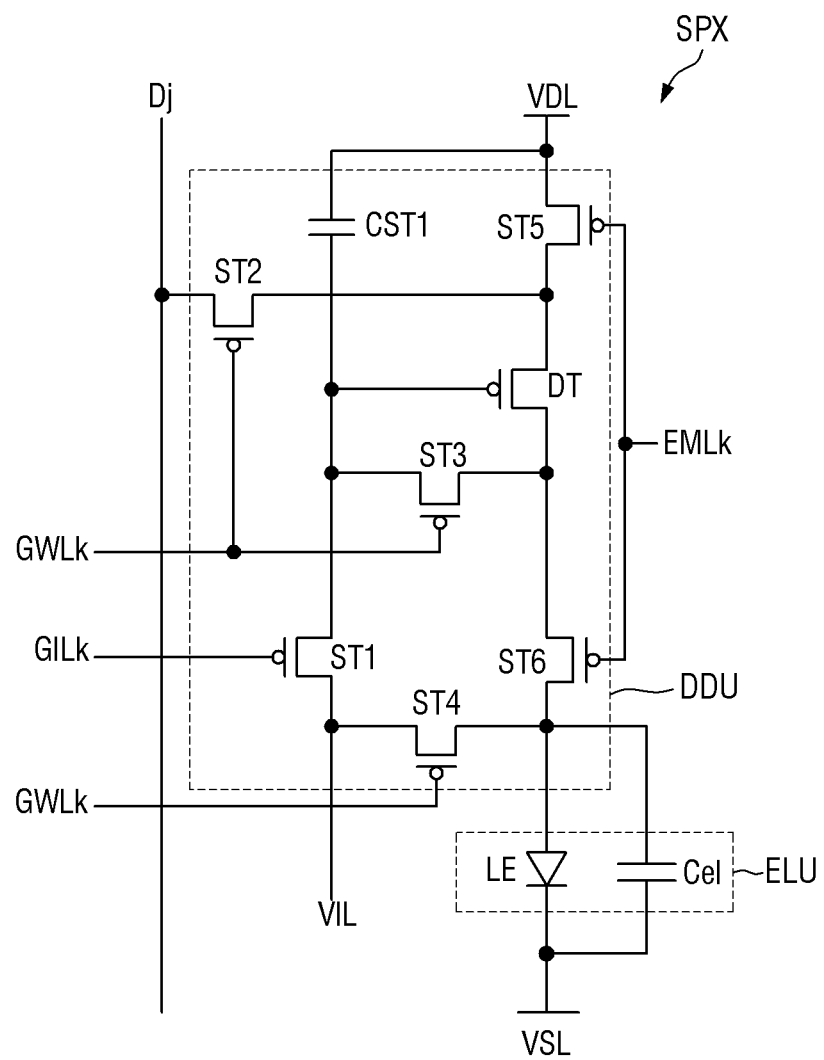
FIG. 2 is a circuit diagram illustrating a display pixel of a display area according to an embodiment.

FIG. 2 is a circuit diagram illustrating a display pixel of a display area according to an embodiment.

Referring to FIG. 2, an embodiment of the display pixel SPX may be connected to a k-th (k is a positive integer) scan initialization line GILk, a k-th scan write line GWLk, and a k-th emission line EMLk. In such an embodiment, the display pixel SPX may be connected to a first power line VSL to which a first power voltage is supplied, a second power line VDL to which a second power voltage is applied, and an initialization voltage line VIL to which an initialization voltage is supplied.

The display pixel SPX may include a light emitting unit ELU and a pixel driver DDU. The light emitting unit ELU may include a light emitting element LE. The pixel driver DDU may supply a driving voltage for driving the light emitting element LE to a pixel electrode of the light emitting element LE. The pixel driver DDU may include a driving transistor DT, switch elements, and a capacitor CST1. The switch elements include first to sixth transistors ST1, ST2, ST3, ST4, ST5, and ST6.

The driving transistor DT may include a gate electrode, a first electrode, and a second electrode. The driving transistor DT controls a drain-source current (hereinafter, referred to as a "driving current") flowing between the first electrode and the second electrode in response to a data voltage applied to the gate electrode.

The light emitting element LE emits light corresponding to the driving current. The larger the driving current, the larger the amount of light emitted from the light emitting element LE.

In an embodiment, the light emitting element LE may be an organic light emitting diode including an organic light emitting layer disposed between an anode electrode and a cathode electrode. Alternatively, the light emitting element LE may be an inorganic light emitting element including an inorganic semiconductor disposed between an anode electrode and a cathode electrode. Alternatively, the light emitting element LE may be a quantum dot light emitting element including a quantum dot light emitting layer disposed between an anode electrode and a cathode electrode. Alternatively, the light emitting element LE may be a micro light emitting element including a micro LED disposed between an anode electrode and a cathode electrode.

An anode electrode of the light emitting element LE may be connected to a first electrode of the fourth transistor ST4 and a second electrode of the sixth transistor ST6, and a cathode electrode of the light emitting element EL may be connected to the first power line VSL. A parasitic capacitance Cel may be formed or connected between the anode electrode and the cathode electrode of the light emitting element LE.

Figure 4:
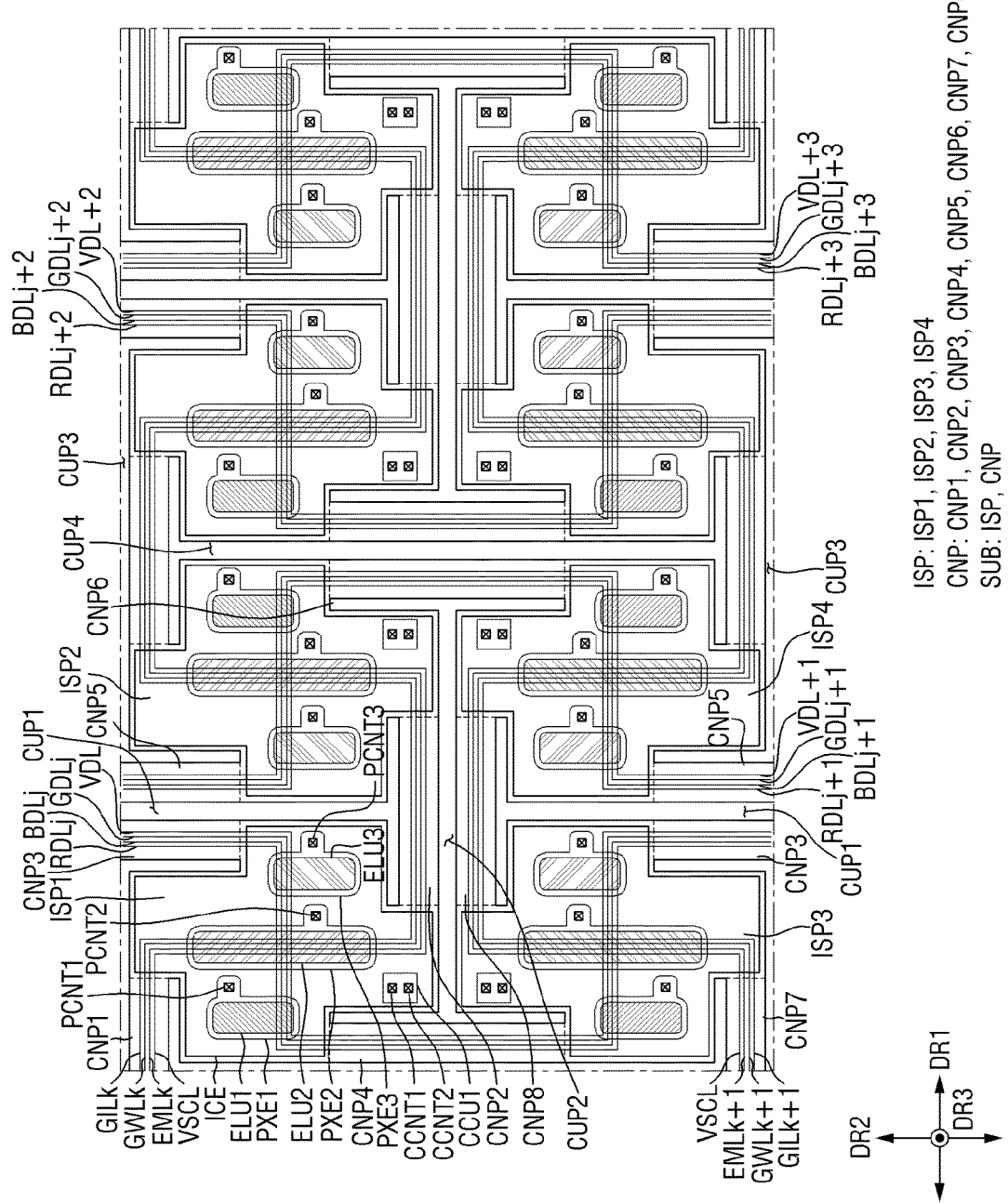
FIGS. 4 and 5 are plan views illustrating a display area according to an embodiment in detail.
Figure 5:
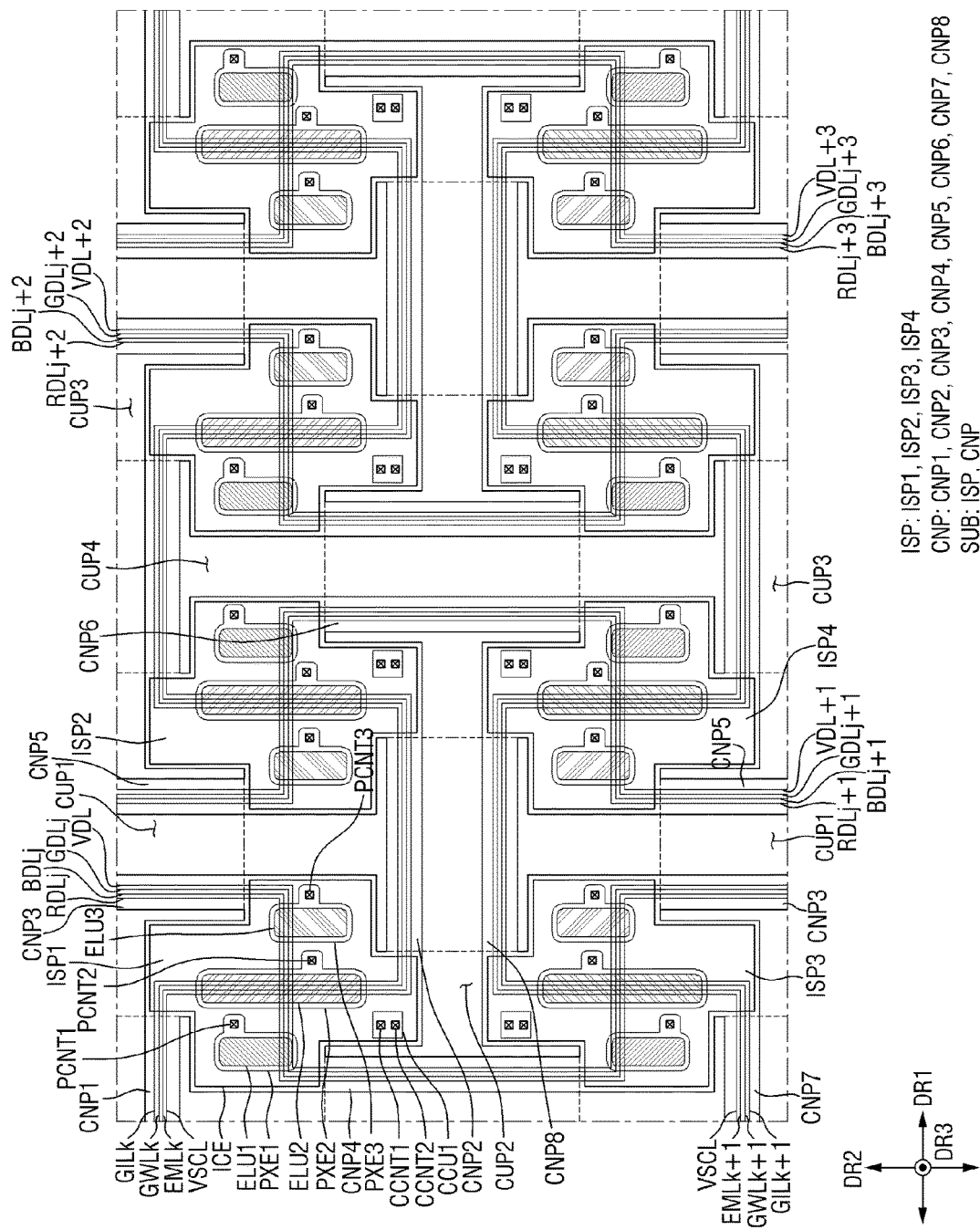

The anode electrode of the light emitting element LE may be the first pixel electrode PXE1, the second pixel electrode PXE2, and the third pixel electrode PXE3 illustrated in FIGS. 4 and 5. In addition, the cathode electrode of the light emitting element LE may be an island common electrode ICE illustrated in FIGS. 4 and 5.

The first transistor ST1 is turned on by a scan initialization signal of the k-th scan initialization line GILk to connect the gate electrode of the driving transistor DT to the initialization voltage line VIL. Accordingly, a third power voltage of the initialization voltage line VIL may be applied to the gate electrode of the driving transistor DT. A gate electrode of the first transistor ST1 may be connected to the k-th scan initialization line GILk, a first electrode of the first transistor ST1 may be connected to the gate electrode of the driving transistor DT, and a second electrode of the first transistor ST1 may be connected to the initialization voltage line VIL.

The second transistor ST2 is turned on by a scan write signal of the k-th scan write line GWLk to connect the first electrode of the driving transistor DT to a j-th (j is a positive integer) data line Dj. Accordingly, a data voltage of the j-th data line Dj may be applied to the first electrode of the driving transistor DT. A gate electrode of the second transistor ST2 may be connected to the k-th scan write line GWLk, a first electrode of the second transistor ST2 may be connected to the first electrode of the driving transistor DT, and a second electrode of the second transistor ST2 may be connected to the j-th data line Dj. The j-th data line Dj may be connected to the display pad PD.

The third transistor ST3 is turned on by the scan write signal of the k-th scan write line GWLk to connect the gate electrode and a second electrode of the driving transistor DT to each other. When the gate electrode and the second electrode of the driving transistor DT are connected to each other, the driving transistor DT is driven as a diode. A gate electrode of the third transistor ST3 may be connected to the k-th scan write line GWLk, a first electrode of the third transistor ST3 may be connected to the second electrode of the driving transistor DT, and a second electrode of the third transistor ST3 may be connected to the gate electrode of the driving transistor DT.

The fourth transistor ST4 is turned on by the scan write signal of the k-th scan write line GWLk to connect the anode electrode of the light emitting element LE to the initialization voltage line VIL. The third power voltage of the initialization voltage line VIL may be applied to the anode electrode of the light emitting element LE. A gate electrode of the fourth transistor ST4 may be connected to the k-th scan write line GWLk, a first electrode of the fourth transistor ST4 may be connected to the anode electrode of the light emitting element LE, and a second electrode of the fourth transistor ST4 may be connected to the initialization voltage line VIL.

Alternatively, the third transistor ST3 may be turned on by the scan initialization signal of the k-th scan initialization line GILk. In such an embodiment, the gate electrode of the third transistor ST3 may be connected to the k-th scan initialization line GILk.

The fifth transistor ST5 is turned on by an emission signal of the k-th emission line EMLk to connect the first electrode of the driving transistor DT to the second power line VDL. A gate electrode of the fifth transistor ST5 may be connected to the k-th emission line EMLk, a first electrode of the fifth transistor ST5 may be connected to the second power line VDL, and a second electrode of the fifth transistor ST5 may be connected to the first electrode of the driving transistor DT.

The sixth transistor ST6 is disposed between the second electrode of the driving transistor DT and the anode electrode of the light emitting element LE. The sixth transistor ST6 is turned on by an emission control signal of the k-th emission line EMLk to connect the second electrode of the driving transistor DT to the anode electrode of the light emitting element LE. A gate electrode of the sixth transistor ST6 may be connected to the k-th emission line EMLk, a first electrode of the sixth transistor ST6 may be connected to the second electrode of the driving transistor DT, and the second electrode of the sixth transistor ST6 may be the anode electrode of the light emitting element LE.

When both the fifth transistor ST5 and the sixth transistor ST6 are turned on, the driving current of the driving transistor DT corresponding to the data voltage applied to the gate electrode of the driving transistor DT may flow to the light emitting element LE.

The capacitor CST1 is formed or connected between the gate electrode of the driving transistor DT and the second power line VDL. A first capacitor electrode of the capacitor CST1 may be connected to the gate electrode of the driving transistor DT, and a second capacitor electrode of the capacitor CST1 may be connected to the second power line VDL.

In an embodiment, the first electrode of each of the first to sixth transistors ST1, ST2, ST3, ST4, ST5, and ST6 and the driving transistor DT is a source electrode, and the second electrode of each of the first to sixth transistors ST1, ST2, ST3, ST4, ST5, and ST6 and the driving transistor DT is a drain electrode. Alternatively, the first electrode of each of the first to sixth transistors ST1, ST2, ST3, ST4, ST5, and ST6 and the driving transistor DT is a drain electrode, and the second electrode of each of the first to sixth transistors ST1, ST2, ST3, ST4, ST5, and ST6 and the driving transistor DT is a source electrode.

An active layer of each of the first to sixth transistors ST1, ST2, ST3, ST4, ST5, and ST6 and the driving transistor DT may include or be formed of at least one selected from polysilicon, amorphous silicon, and an oxide semiconductor. In an embodiment, as shown in FIG. 2, the first to sixth transistors ST1, ST2, ST3, ST4, ST5, and ST6, and the driving transistor DT may be P-type metal oxide semiconductor field effect transistors ("MOSFET"s), but the disclosure is not limited thereto. In an alternative embodiment, for example, the first to sixth transistors ST1, ST2, ST3, ST4, ST5, and ST6, and the driving transistor DT may also be N-type MOSFETs. Alternatively, at least one of the first to sixth transistors ST1, ST2, ST3, ST4, ST5, and ST6 may be an N-type MOSFET.

Figure 3:
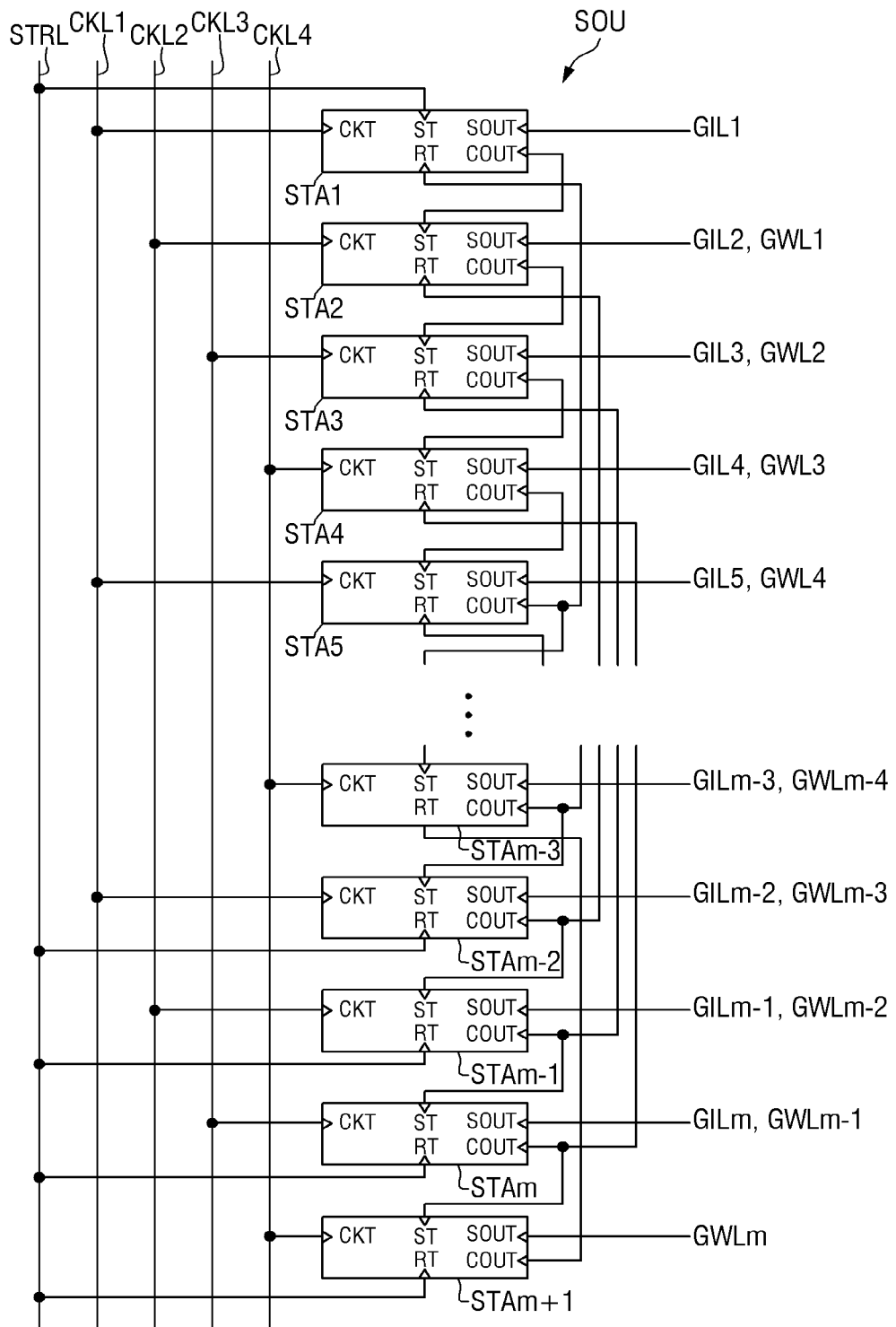
FIG. 3 is an illustrative view illustrating a first scan driver according to an embodiment.

FIG. 3 is an illustrative view illustrating a scan signal output unit of a first scan driver according to an embodiment.

Referring to FIG. 3, a scan signal output element SOU of a first scan driver SDC1 may include a plurality of stages STA1, STA2, STA3, STA4, . . . , STAm−1, STAm, and STAm+1 (m is a positive integer). Each of the plurality of stages STA1, STA2, STA3, STA4, . . . , STAm−1, STAm, and STAm+1 may include a start signal input unit ST, a reset signal input unit RT, a clock signal input unit CKT, a scan signal output unit SOUT, and a carry signal output unit COUT.

The start signal input unit ST of each of the plurality of stages STA1, STA2, STA3, STA4, . . . , STAm−1, STAm, and STAm+1 may be connected to a start line STRL or a carry signal output unit COUT of the previous stage. In an embodiment, for example, a start signal input unit ST of a first stage STA1 may be connected to a scan start line STRL to which a scan start signal is input. In addition, the start signal input unit ST of each of the plurality of stages STA2, STA3, STA4, . . . , STAm−1, STAm, and STAm+1 except for the first stage STA1 may be connected to the carry signal output unit COUT of the previous stage. In an embodiment, for example, a start signal input unit ST of a second stage STA2 may be connected to the carry signal output unit COUT of the first stage STA1, and a start signal input unit ST of a third stage STA3 may be connected to the carry signal output unit COUT of the second stage STA2.

The reset signal input unit RT of each of the plurality of stages STA1, STA2, STA3, STA4, ..., STAm−1, STAm, and STAm+1 may be connected to a carry signal output unit COUT of the subsequent stage. In an embodiment, for example, a reset signal input unit RT of the first stage STA1 may be connected to a carry signal output unit COUT of a fifth stage STA5.

The clock signal input unit CKT of each of the plurality of stages STA1, STA2, STA3, STA4, ..., STAm−1, STAm, and STAm+1 may be connected to a corresponding or predetermined one of clock lines CKL1, CKL2, CKL3, and CKL4.

The plurality of stages STA1, STA2, STA3, STA4, ..., STAm−1, STAm, and STAm+1 may be alternately connected to the clock lines CKL1, CKL2, CKL3, and CKL4. In an embodiment, for example, a clock signal input unit CKT of the first stage STA1 may be connected to a first clock line CKL1, and a clock signal input unit CKT of the second stage STA2 may be connected to a second clock line CKL2. In such an embodiment, a clock signal input unit CKT of the third stage STA3 may be connected to a third clock line CKL3, and a clock signal input unit CKT of a fourth stage STA4 may be connected to a fourth clock line CKL4.

The scan signal output unit SOUT of each of the plurality of stages STA1, STA2, STA3, STA4, ..., STAm−1, STAm, and STAm+1 may be connected to a scan write line and a scan initialization line corresponding thereto. In an embodiment, for example, a scan signal output unit SOUT of the first stage STA1 may be connected to a first scan initialization line GIL1. In such an embodiment, a scan signal output unit SOUT of the second stage STA2 may be connected to a second scan initialization line GIL2 and a first scan write line GWL1. In such an embodiment, a scan signal output unit SOUT of the third stage STA3 may be connected to a third scan initialization line GIL3 and a second scan write line GWL2. In such an embodiment, a scan signal output unit SOUT of the fourth stage STA4 may be connected to a fourth scan initialization line GIL4 and a third scan write line GWL3. In such an embodiment, a scan signal output unit SOUT of the fourth stage STA5 may be connected to a fifth scan initialization line GIL5 and a fourth scan write line GWL4. In such an embodiment, a scan signal output unit SOUT of an (m−3)-th stage STAm−3 may be connected to an (m−3)-th scan initialization line GILm−3 and an (m−4)-th scan write line GWLm−4. In such an embodiment, a scan signal output unit SOUT of an (m−2)-th stage STAm−2 may be connected to an (m−2)-th scan initialization line GILm−2 and an (m−3)-th scan write line GWLm−3. In such an embodiment, a scan signal output unit SOUT of an (m−1)-th stage STAm−1 may be connected to an (m−1)-th scan initialization line GILm−1 and an (m−2)-th scan write line GWLm−2. In such an embodiment, a scan signal output unit SOUT of an m-th stage STAm may be connected to an m-th scan initialization line GILm and an (m−1)-th scan write line GWLm−1. such an embodiment, a scan signal output unit SOUT of an (m+1)-th stage STAm+1 may be connected to an m-th scan write line GWLm.

The carry signal output unit COUT of each of the plurality of stages STA1, STA2, STA3, STA4, ..., STAm−1, STAm, and STAm+1 may be connected to a reset signal input unit RT of the previous stage and a start signal input unit ST of the subsequent stage. However, the carry signal output unit COUT of each of the first stage STA1, the second stage STA2, the third stage STA3, and the fourth stage STA4 may be connected only to the start signal input unit ST of the subsequent stage.

In an embodiment, a scan signal output unit of a second scan driver SDC2 may be substantially the same as the scan signal output unit of the first scan driver SDC1 described with reference to FIG. 3, and thus, any repetitive detailed description thereof will be omitted.

Figure 6:
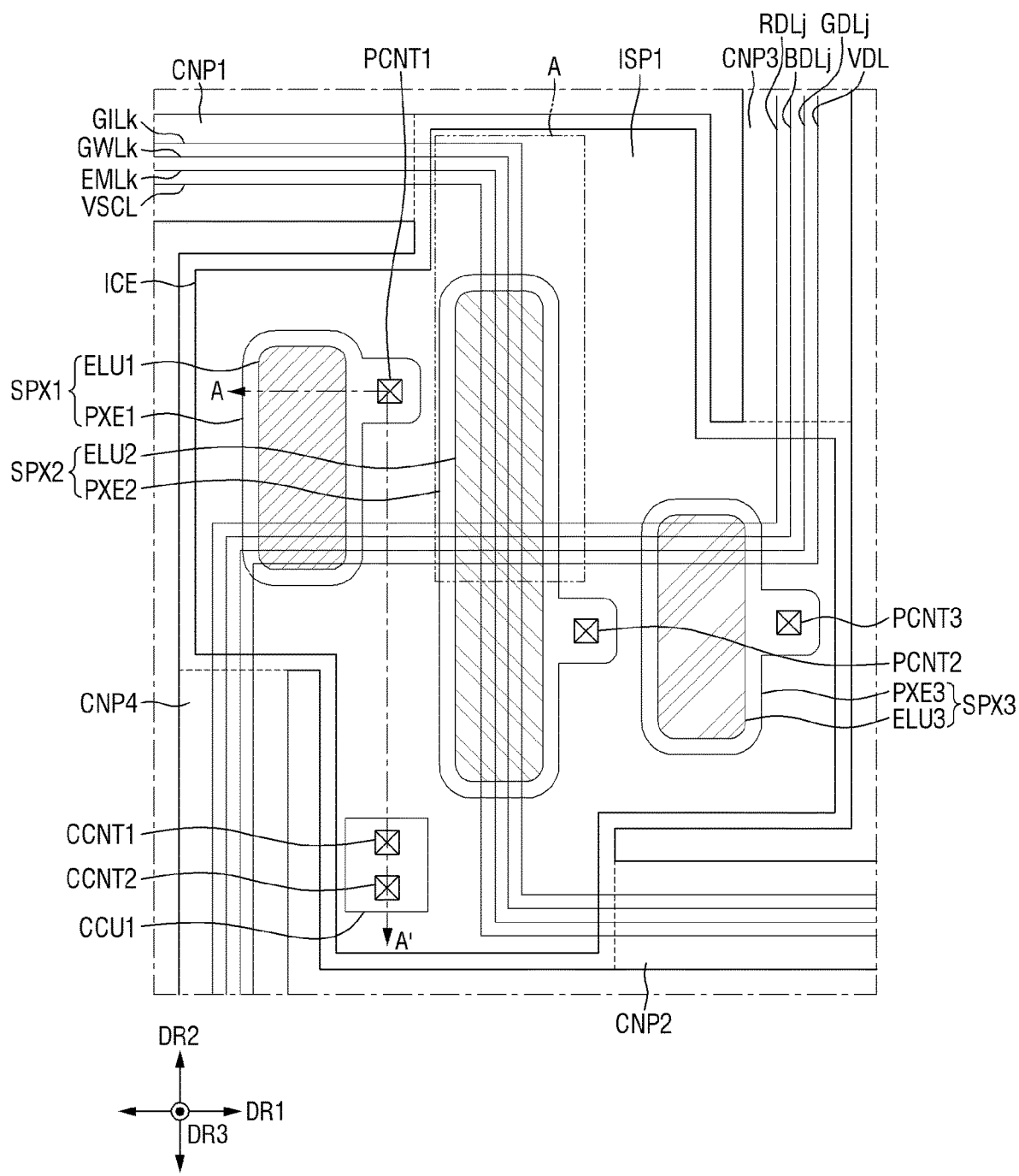
FIG. 6 is a plan view illustrating a first island pattern of FIG. 4 in detail.
Figure 7:
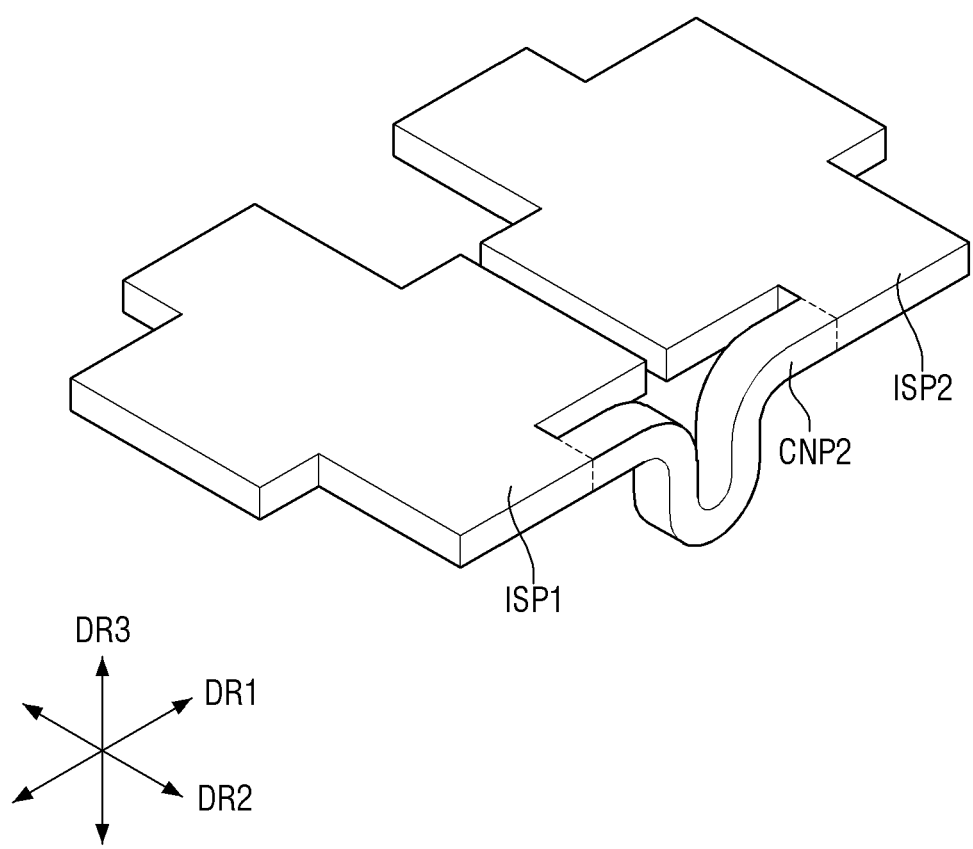
FIGS. 7 and 8 are perspective views illustrating first and second island patterns and a second connection pattern according to an embodiment.
Figure 8:
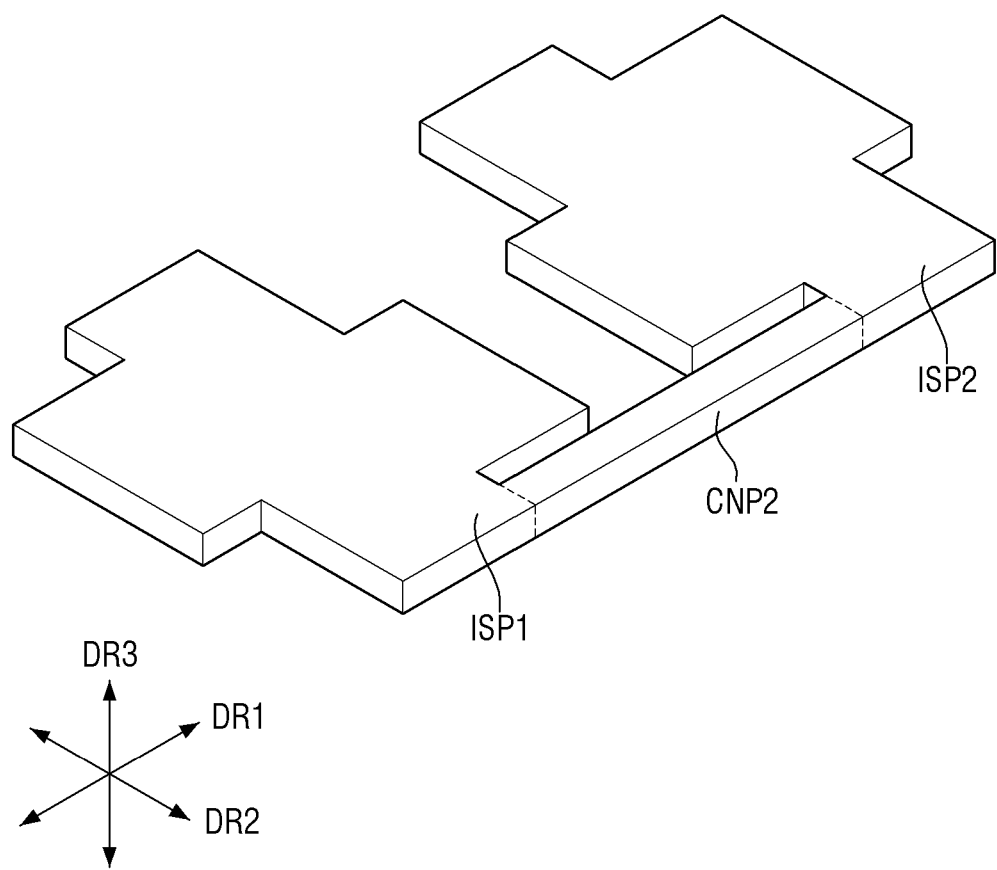

FIGS. 4 and 5 are plan views illustrating a display area according to an embodiment in detail. FIG. 6 is a plan view illustrating a first island pattern of FIG. 4 in detail. FIGS. 7 and 8 are perspective views illustrating first and second island patterns and a second connection pattern according to an embodiment.

In FIG. 4, island patterns ISP1 to ISP4, connection patterns CNP1 to CNP8, and cutout parts CUP1 to CUP4 of the display area DA when the display device 10 is contracted (or unstretched) are illustrated. In FIG. 5, island patterns ISP1 to ISP4, connection patterns CNP1 to CNP8, and cutout parts CUP1 to CUP4 of the display area DA when the display device 10 is stretched are illustrated.

Referring to FIGS. 4 to 6, a substrate SUB may include island patterns ISP and connection patterns CNP defined by the cutout parts CUP1 to CUP4 which are cut out in the display area DA. The cutout parts CUPT to CUP4 may be areas in which the substrate SUB is removed by a patterning process such as a laser process or a dry etching process.

The display area DA may include first to fourth island patterns ISP1 to ISP4, first to eighth connection patterns CNP1 to CNP8, and first to fourth cutout parts CUP1 to CUP4.

The first to fourth island patterns ISP1 to ISP4 may be spaced apart from each other. The first island patterns ISP1 and the second island patterns ISP2 may be alternately disposed in the first direction DR1. The third island patterns ISP3 and the fourth island patterns ISP4 may be alternately disposed in the first direction DR1. The first island patterns ISP1 and the third island patterns ISP3 may be alternately disposed in the second direction DR2. The second island patterns ISP2 and the fourth island patterns ISP4 may be alternately disposed in the second direction DR2.

The first connection pattern CNP1 may connect the first island pattern ISP1 and the second island pattern ISP2 disposed on the left side of the first island pattern ISP1 to each other. The first connection pattern CNP1 may be connected to the upper side of the first island pattern ISP1. The first connection pattern CNP1 may extend in the first direction DR1.

The second connection pattern CNP2 may connect the first island pattern ISP1 and the second island pattern ISP2 disposed on the right side of the first island pattern ISP1 to each other. The second connection pattern CNP2 may be connected to the lower side of the first island pattern ISP1. The second connection pattern CNP2 may extend in the first direction DR1.

The third connection pattern CNP3 may connect the first island pattern ISP1 and the third island pattern ISP3 disposed on the upper side of the first island pattern ISP1 to each other. The third connection pattern CNP3 may be connected to the right side of the first island pattern ISP1. The third connection pattern CNP3 may extend in the second direction DR2.

The fourth connection pattern CNP4 may connect the first island pattern ISP1 and the third island pattern ISP3 disposed on the lower side of the first island pattern ISP1 to each other. The fourth connection pattern CNP4 may be connected to the left side of the first island pattern ISP1. The fourth connection pattern CNP4 may extend in the second direction DR2.

The fifth connection pattern CNP5 may connect the second island pattern IPS2 and the fourth island pattern IPS4 disposed on the upper side of the second island pattern IPS2 to each other. The fifth connection pattern CNP5 may be connected to the left side of the second island pattern ISP2. The fifth connection pattern CNP5 may extend in the second direction DR2.

The sixth connection pattern CNP6 may connect the second island pattern IPS2 and the fourth island pattern IPS4 disposed on the lower side of the second island pattern IPS2 to each other. The sixth connection pattern CNP6 may be connected to the right side of the second island pattern ISP2. The sixth connection pattern CNP6 may extend in the second direction DR2.

The seventh connection pattern CNP7 may connect the third island pattern IPS3 and the fourth island pattern IPS4 disposed on the left side of the third island pattern IPS3 to each other. The seventh connection pattern CNP7 may be connected to the lower side of the third island pattern ISP3. The seventh connection pattern CNP7 may extend in the first direction DR1.

The eighth connection pattern CNP8 may connect the third island pattern IPS3 and the fourth island pattern IPS4 disposed on the right side of the third island pattern IPS3 to each other. The eighth connection pattern CNP8 may be connected to the upper side of the fourth island pattern ISP4. The eighth connection pattern CNP8 may extend in the first direction DR1.

The first cutout part CUP1 may be defined between the first island pattern ISP1 and the second island pattern ISP2, between the third connection pattern CNP3 and the fifth connection pattern CNP5, between the first island pattern ISP1 and the second connection pattern CNP2, and between the second island pattern ISP2 and the second connection pattern CNP2. In addition, the first cutout part CUP1 may be defined between the third island pattern ISP3 and the fourth island pattern ISP4, between the third island pattern ISP3 and the eighth connection pattern CNP8, and between the fourth island pattern ISP4 and the eighth connection pattern CNP8.

The second cutout part CUP2 may be defined between the first island pattern ISP1 and the third island pattern ISP3, between the first island pattern ISP1 and the fourth connection pattern CNP4, between the third island pattern ISP3 and the fourth connection pattern CNP4, and between the second connection pattern CNP2 and the eighth connection pattern CNP8. In addition, the second cutout part CUP2 may be defined between the second island pattern ISP2 and the fourth island pattern ISP4, between the second island pattern ISP2 and the sixth connection pattern CNP6, and between the fourth island pattern ISP4 and the sixth connection pattern CNP6.

The third cutout part CUP3 may be defined between the first island pattern ISP1 and the third island pattern ISP3, between the first island pattern ISP1 and the third connection pattern CNP3, between the third island pattern ISP3 and the third connection pattern CNP3, and between the first connection pattern CNP1 and the seventh connection pattern CNP7. In addition, the third cutout part CUP3 may be defined between the second island pattern ISP2 and the fourth island pattern ISP4, between the second island pattern ISP2 and the fifth connection pattern CNP5, and between the fourth island pattern ISP4 and the fifth connection pattern CNP5.

The fourth cutout part CUP4 may be defined between the first island pattern ISP1 and the second island pattern ISP2, between the first island pattern ISP1 and the first connection pattern CNP1, between the second island pattern ISP2 and the first connection pattern CNP1, and between the fourth connection pattern CNP4 and the sixth connection pattern CNP6. In addition, the fourth cutout part CUP4 may be defined between the third island pattern ISP3 and the fourth island pattern ISP4, between the third island pattern ISP3 and the seventh connection pattern CNP7, and between the fourth island pattern ISP4 and the seventh connection pattern CNP7.

When the display device 10 is contracted as illustrated in FIG. 7, the second connection pattern CNP2 may be bent in a third direction DR3. When the display device 10 is stretched as illustrated in FIG. 8, the second connection pattern CNP2 may be unbent. Therefore, a length of the second connection pattern CNP2 in the first direction DR1 when the display device 10 is stretched in the first direction DR1 may be greater than that when the display device 10 is contracted.

Similarly, when the display device 10 is contracted, each of the first and third to eighth connection patterns CNP1 and CNP3 to CNP8 may be bent in the third direction DR3. When the display device 10 is stretched, each of the first and third to eighth connection patterns CNP1 and CNP3 to CNP8 may be unbent. Therefore, a length of the third connection pattern CNP3 in the second direction DR2, a length of the fourth connection pattern CNP4 in the second direction DR2, a length of the fifth connection pattern CNP5 in the second direction DR2, and a length of the sixth connection pattern CNP6 in the second direction DR2 when the display device 10 is stretched in the second direction DR2 may be greater than those when the display device 10 is contracted. In addition, a length of the first connection pattern CNP1 in the first direction DR1, a length of the seventh connection pattern CNP7 in the first direction DR1, and a length of the eighth connection pattern CNP8 in the first direction DR1 when the display device 10 is stretched in the first direction DR1 may be greater than those when the display device 10 is contracted. Therefore, a width of each of the cutout parts CUP1 to CUP4 when the display device 10 is stretched may be greater than a width of each of the cutout parts CUP1 to CUP4 when the display device 10 is contracted.

Scan initialization lines GILk/GILk+1, scan write lines GWLk/GWLk+1, emission lines EMLk/EMLk+1, red data lines RDLj/RDLj+1/RDLj+2/RDLj+3, blue data lines BDLj/BDLj+1/BDLj+2/BDLj+3, green data lines GDLj/GDLj+1/GDLj+2/GDLj+3, a first power connection line VSCL, and a second power line VDL/VDL+1/VDL+2/VDL+3 may be disposed in each of the first to fourth island patterns ISP1, ISP2, ISP3, and ISP4 in the display area DA.

A k-th scan initialization line GILk, a k-th scan write line GWLk, a k-th emission line EMLk, and the first power connection line VSCL may sequentially pass (or extend or linearly disposed) through the first connection pattern CNP1, the first island pattern ISP1, the second connection pattern CNP2, and the second island pattern ISP2. In addition, a (k+1)-th scan initialization line GIL, a (k+1)-th scan write line GWLk+1, a (k+1)-th emission line EMLk+1, and the first power connection line VSCL may sequentially pass through the seventh connection pattern CNP7, the third island pattern ISP3, the eighth connection pattern CNP8, and the fourth island pattern ISP4.

That is, in the display area DA, the scan initialization lines GILk/GILk+1, the scan write lines GWLk/GWLk+1, and the emission lines EMLk/EMLk+1 may extend in a zigzag or winding form along the first direction DR1 and be connected to the first scan driver SDC1 and the second scan driver SDC2. In addition, the first power connection line VSCL may extend in a zigzag or winding form along the first direction DR1 in the display area DA and be connected to the first power line VSL in each of the first dummy area DMA1 and the second dummy area DMA2. Therefore, the first power voltage of the first power line VSL may be applied to the first power connection line VSCL.

A j-th red data line RDLj, a j-th blue data line BDLj, and a j-th green data line GDLj, a (j+2)-th red data line RDLj+2, a (j+2)-th blue data line BDLj+2, and a (j+2)-th green data line GDLj+2 may sequentially pass through the third connection pattern CNP3, the first island pattern ISP1, the fourth connection pattern CNP4, and the third island pattern ISP3. In addition, a (j+1)-th red data line RDLj+1, a (j+1)-th blue data line BDLj+1, a (j+1)-th green data line GDLj+1, a (j+3)-th red data line RDLj+3, a (j+3)-th blue data line BDLj+3, and a (j+3)-th green data line GDLj+3 may sequentially pass through the fifth connection pattern CNP5, the second island pattern ISP2, and the sixth connection pattern CNP6, and the fourth island pattern ISP4.

The second power line VDL/VDL+1/VDL+2/VDL+3 may receive a second power voltage. The second power line VDL/VDL+1/VDL+2/VDL+3 may sequentially pass through the third connection pattern CNP3, the first island pattern ISP1, the fourth connection pattern CNP4, and the third island pattern ISP3. In addition, the second power line VDL/VDL+1/VDL+2/VDL+3 may sequentially pass through the fifth connection pattern CNP5, the second island pattern ISP2, the sixth connection pattern CNP6, and the fourth island pattern ISP4. That is, in the display area DA, the red data lines RDLj/RDLj+1/RDLj+2/RDLj+3, the blue data lines BDLj/BDLj+1/BDLj+2/BDLj+3), the green data lines GDLj/GDLj+1/GDLj+2/GDLj+3, and the second power line VDL/VDL+1/VDL+2/VDL+3 may extend in a zigzag or winding form along the second direction DR2.

A first light emitting unit ELU1 of a first display pixel SPX1, a second light emitting unit ELU2 of a second display pixel SPX2, and a third light emitting unit ELU3 of a third display pixel SPX3 may be disposed in each of the first to fourth island patterns ISP1, ISP2, ISP3, and ISP4 in the display area DA. The first light emitting unit ELU1 may be an area that emits light of a first color, for example, light of a red wavelength band. The second light emitting unit ELU2 may be an area that emits light of a second color, for example, light of a blue wavelength band. The third light emitting unit ELU3 may be an area that emits light of a third color, for example, light of a green wavelength band.

The first light emitting unit ELU1, the second light emitting unit ELU2, and the third light emitting unit ELU3 may be arranged in the first direction DR1. The first light emitting unit ELU1 may be disposed on one side of the second light emitting unit ELU2, and the third light emitting unit ELU3 may be disposed on another side (or an opposing side) of the second light emitting unit ELU2. An area of the second light emitting unit ELU2 may be greater than an area of the first light emitting unit ELU1 and an area of the third light emitting unit ELU3.

The first pixel electrode PXE1 of the first light emitting unit ELU1, the second pixel electrode PXE2 of the second light emitting unit ELU2, and the third pixel electrode PXE3 of the third light emitting unit ELU3 may be arranged in the first direction DR1. The first pixel electrode PXE1 may be disposed on one side of the second pixel electrode PXE2, and the third pixel electrode PXE3 may be disposed on another side (or an opposing side) of the second pixel electrode PXE2. An area of the second pixel electrode PXE2 may be greater than an area of the first pixel electrode PXE1 and an area of the third pixel electrode PXE3. In addition, the area of the first pixel electrode PXE1 may be greater than the area of the first light emitting unit ELU1, the area of the second pixel electrode PXE2 may be greater than the area of the second light emitting unit ELU2, and the area of the third pixel electrode PXE3 may be greater than the area of the third light emitting unit ELU3.

The first pixel electrode PXE1 may be connected to a first pixel driver through a first pixel contact hole PCNT1, and may thus receive a driving voltage of the first pixel driver. The second pixel electrode PXE2 may be connected to a second pixel driver through a second pixel contact hole PCNT2, and may thus receive a driving voltage of the second pixel driver. The third pixel electrode PXE3 may be connected to a third pixel driver through a third pixel contact hole PCNT3, and may thus receive a driving voltage of the third pixel driver.

In an embodiment, as illustrated in FIGS. 4 and 5, the second pixel electrode PXE2 of the second light emitting unit ELU2 overlaps the scan initialization lines GILk/GILk+1, the scan write lines GWLk/GWLk+1, the emission lines EMLk/EMLk+1, and the first power connection line VSCL and the first pixel electrode PXE1 of the first light emitting unit ELU1, the second pixel electrode PXE2 of the second light emitting unit ELU2, and the third pixel electrode PXE3 of the third light emitting unit ELU3 overlap the red data lines RDLj/RDLj+1/RDLj+2/RDLj+3, the blue data lines BDLj/BDLj+1/BDLj+2/BDLj+3, the green data lines GDLj/GDLj+1/GDLj+2/GDLj+3, and the second power line VDL/VDL+1/VDL+2/VDL+3, but an embodiment of the disclosure is not limited thereto. In an embodiment, at least one selected from the first pixel electrode PXE1 of the first light emitting unit ELU1, the second pixel electrode PXE2 of the second light emitting unit ELU2, and the third pixel electrode PXE3 of the third light emitting unit ELU3 may overlap at least one selected from the scan initialization lines GILk/GILk+1, the scan write lines GWLk/GWLk+1, the emission lines EMLk/EMLk+1, the first power connection line VSCL, the red data lines RDLj/RDLj+1/RDLj+2/RDLj+3, the blue data lines BDLj/BDLj+1/BDLj+2/BDLj+3, the green data lines GDLj/GDLj+1/GDLj+2/GDLj+3, and the second power line VDL/VDL+1/VDL+2/VDL+3.

The island common electrode ICE may be disposed in each of the first to fourth island patterns ISP1, ISP2, ISP3, and ISP4 in the display area DA. In each of the first to fourth island patterns ISP1, ISP2, ISP3, and ISP4, the island common electrode ICE may be connected to a first common connection electrode CCU1 through a first common contact hole CCNT1. In an embodiment, the island common electrode ICE may not be disposed in the first to eighth connection patterns CNP1 to CNP8 to prevent the island common electrode ICE from being damaged according to a change in length of each of the first to eighth connection patterns CNP1 to CNP8.

The first common connection electrode CCU1 may be disposed in each of the first to fourth island patterns ISP1, ISP2, ISP3, and ISP4 in the display area DA. The first common connection electrode CCU1 may be connected to the first power connection line VSCL through a second common contact hole CCNT2. Although not illustrated in FIGS. 4 to 6, the first power connection line VSCL may overlap the first common connection electrode CCU1 and the second common contact hole CCNT2 in the third direction DR3. Therefore, the first power voltage of the first power line VSL may be supplied to the island common electrode ICE through the first power connection line VSCL and the first common connection electrode CCU1.

The first common connection electrode CCU1 may be disposed in or directly on a same layer as the first pixel electrode PXE1, the second pixel electrode PXE2, and the third pixel electrode PXE3. Therefore, the first common connection electrode CCU1 may not overlap the first pixel electrode PXE1, the second pixel electrode PXE2, and the third pixel electrode PXE3.

In an embodiment, as illustrated in FIGS. 4 to 6, the first to fourth island patterns ISP1 to ISP4 partitioned by the cutout parts CUP1 to CUP4 may be connected to each other by the first to eighth connection patterns CNP1 to CNP8, and the first to eighth connection patterns CNP1 to CNP8 may be in a bent state when the display device 10 is contracted, but may be in an unbent state when the display device 10 is stretched. Therefore, shapes of the first to fourth island patterns ISP1 to ISP4 do not change and lengths of the first to eighth connection patterns CNP1 to CNP8 change, such that a width of each of the cutout parts CUP1 to CUP4 may be increased or decreased. Accordingly, the display area DA may be effectively stretched and contracted.

Figure 9:
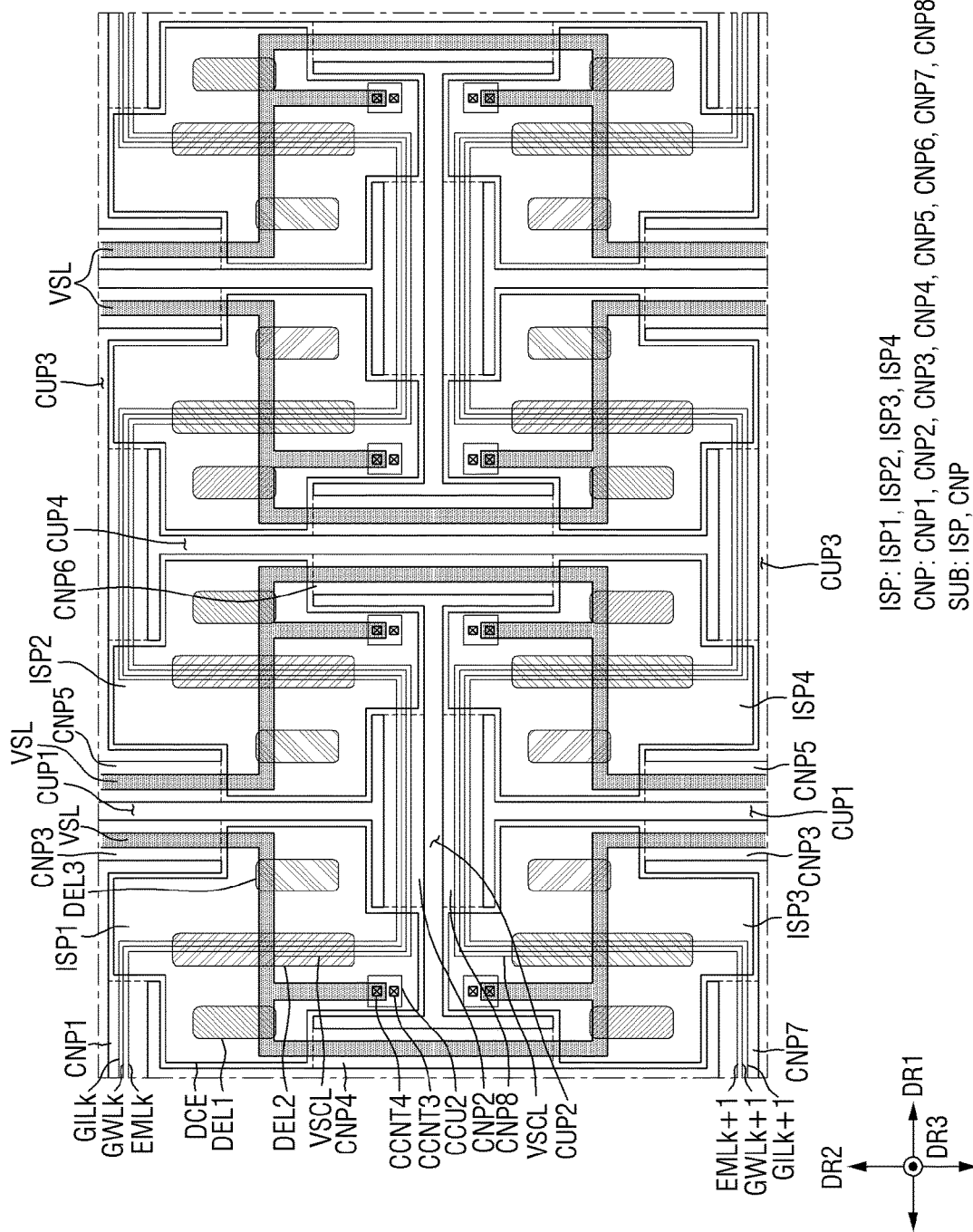
FIGS. 9 and 10 are plan views illustrating a first dummy area according to an embodiment in detail.
Figure 10:
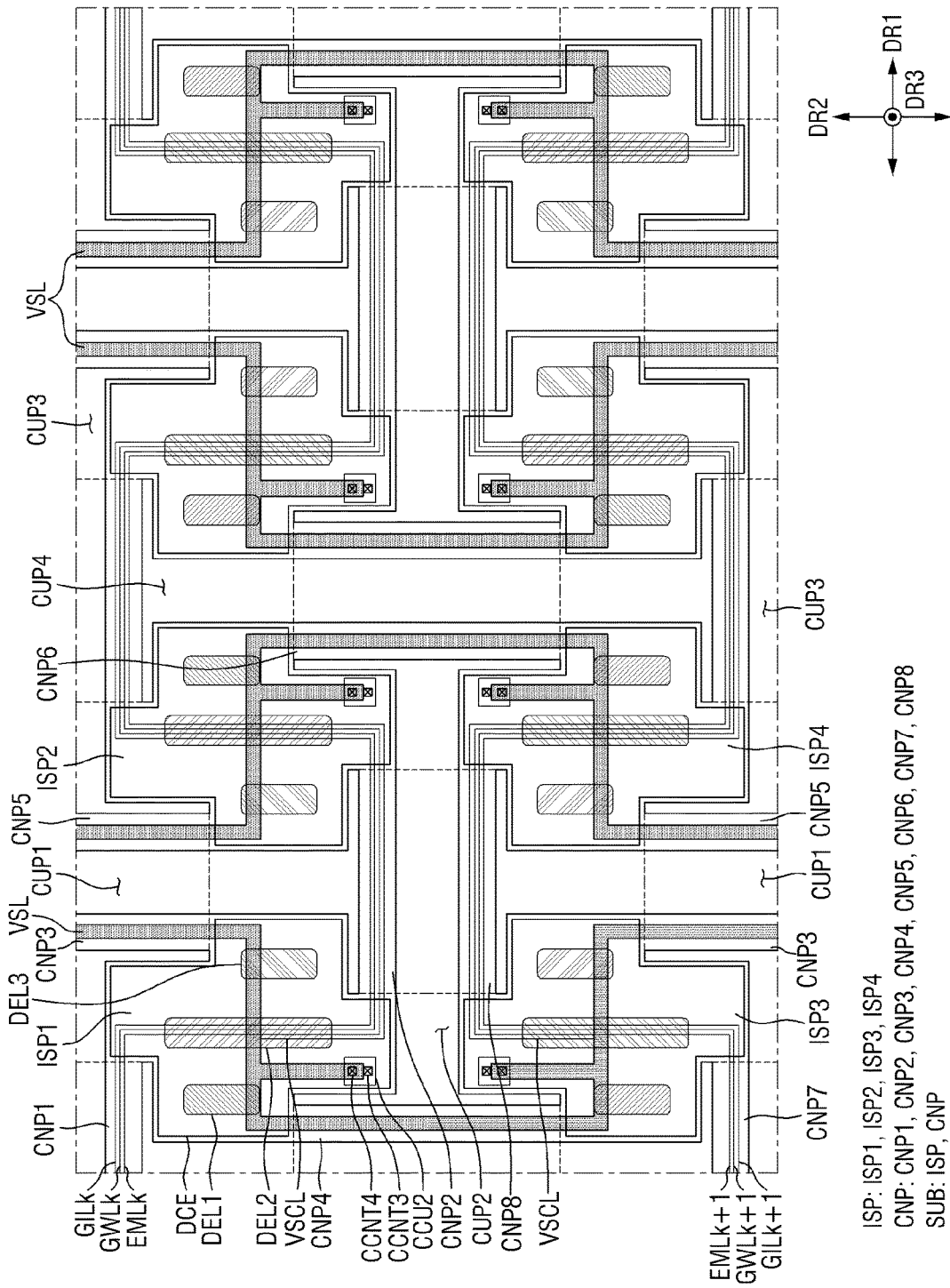
Figure 11:
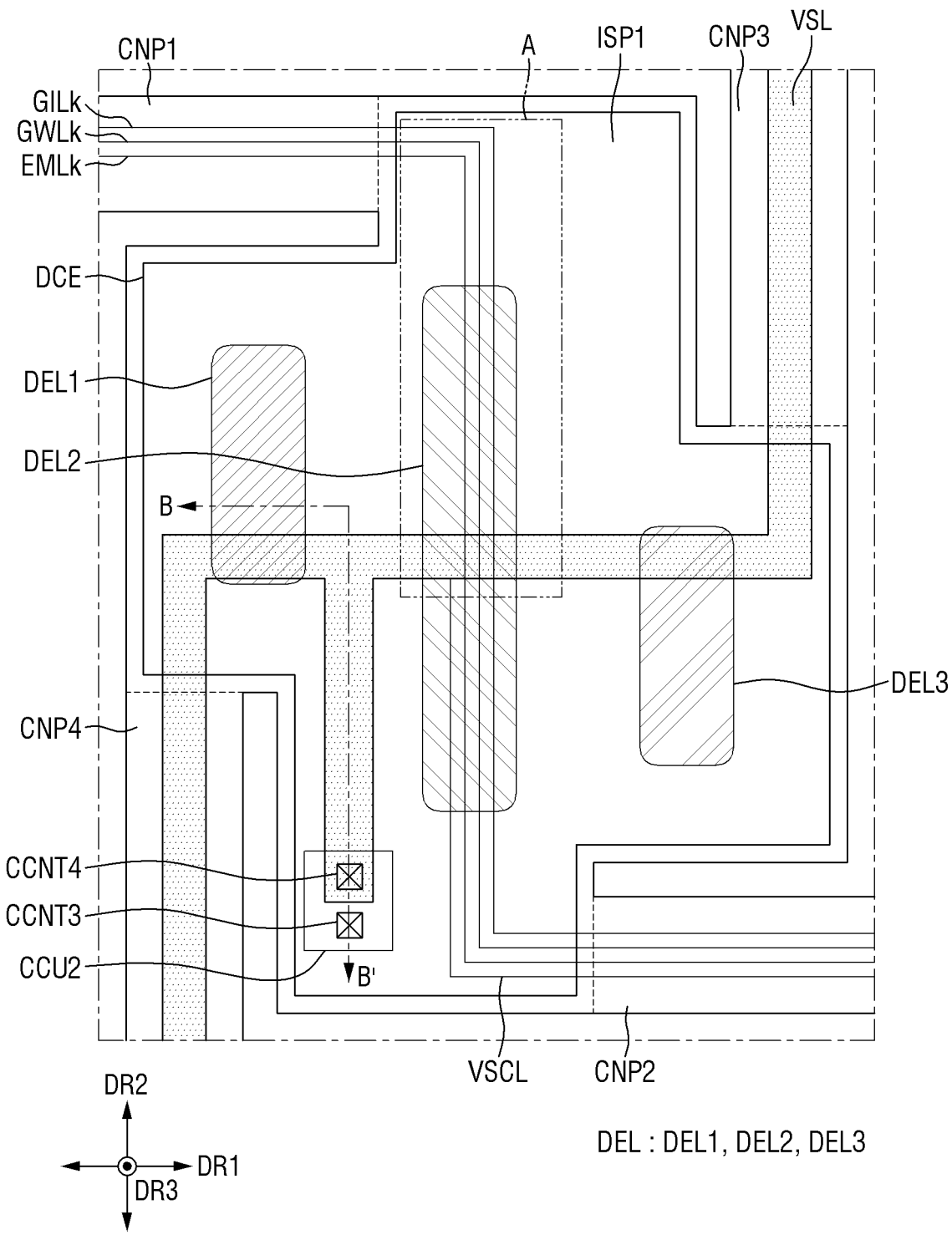
FIG. 11 is a plan view illustrating a first island pattern of FIG. 9 in detail.

FIGS. 9 and 10 are plan views illustrating a first dummy area according to an embodiment in detail. FIG. 11 is a plan view illustrating a first island pattern of FIG. 9 in detail.

In FIG. 9, island patterns ISP1 to ISP4, connection patterns CNP1 to CNP8, and cutout parts CUP1 to CUP4 of the first dummy area DMA1 when the display device 10 is contracted are illustrated. In FIG. 10, island patterns ISP1 to ISP4, connection patterns CNP1 to CNP8, and cutout parts CUP1 to CUP4 of the first dummy area DMA1 when the display device 10 is stretched are illustrated.

Referring to FIGS. 9 to 11, the substrate SUB may include island patterns ISP and connection patterns CNP defined by the cutout parts CUP1 to CUP4 which are cut out in the first dummy area DMA1. The island patterns ISP and the connection patterns CNP of the first dummy area DMA1 may be substantially the same as the island patterns ISP and the connection patterns CNP of the display area DA described above with reference to FIGS. 4 to 6. Therefore, any repetitive detailed description of the island patterns ISP and the connection patterns CNP of the first dummy area DMA1 will be omitted.

Scan initialization lines GILk/GILk+1, scan write lines GWLk/GWLk+1, emission lines EMLk/EMLk+1, a first power connection line VSCL, and a first power line VSL may be disposed in each of first to fourth island patterns ISP1, ISP2, ISP3, and ISP4 in the first dummy area DMA1.

A k-th scan initialization line GILk, a k-th scan write line GWLk, and a k-th emission line EMLk may sequentially pass through the first connection pattern CNP1, the first island pattern ISP1, the second connection pattern CNP2, and the second island pattern ISP2. In addition, a (k+1)-th scan initialization line GIL, a (k+1)-th scan write line GWLk+1, and a (k+1)-th emission line EMLk+1 may sequentially pass through the seventh connection pattern CNP7, the third island pattern ISP3, the eighth connection pattern CNP8, and the fourth island pattern ISP4. That is, in the first dummy area DA, the scan initialization lines GILk/GILk+1, the scan write lines GWLk/GWLk+1, and the emission lines EMLk/EMLk+1 may extend in a zigzag or winding form along the first direction DR1 and be connected to the first scan driver SDC1 and the second scan driver SDC2.

The first power line VSL may sequentially pass through the third connection pattern CNP3, the first island pattern ISP1, the fourth connection pattern CNP4, and the second island pattern ISP2. In addition, the first power line VSL may sequentially pass through the fifth connection pattern CNP5, the second island pattern ISP2, the sixth connection pattern CNP6, and the fourth island pattern ISP4. The first power line VSL may be connected to a second common connection electrode CCU2 through a fourth common contact hole CCNT4 in each of the first to fourth island patterns ISP1, ISP2, ISP3, and ISP4. That is, in the first dummy area DMA1, the first power line VSL may extend in a zigzag or winding form along the second direction DR2.

In each of the first to fourth island patterns ISP1, ISP2, ISP3, and ISP4, the first power connection line VSCL may be branched from the first power line VSL. In the first dummy area DMA1, the first power connection line VSCL may extend in a zigzag or winding form along the first direction DR1.

In an embodiment, for example, as illustrated in FIG. 9, the first power connection line VSCL branched from the first power line VSL in the first island pattern ISP1 may extend to the second connection pattern CNP2, the second island pattern ISP2, and the first connection pattern CNP1. In such an embodiment, the first power connection line VSCL branched from the first power line VSL in the first island pattern ISP1 and extending to the second island pattern ISP2 may be connected to the first power line VSL in the second island pattern ISP2.

In an embodiment, as illustrated in FIG. 9, the first power connection line VSCL branched from the first power line VSL in the third island pattern ISP3 may extend to the eighth connection pattern CNP8, the fourth island pattern ISP4, and the seventh connection pattern CNP7. In such an embodiment, the first power connection line VSCL branched from the first power line VSL in the third island pattern ISP3 and extending to the fourth island pattern ISP4 may be connected to the first power line VSL in the fourth island pattern ISP4.

A first dummy emission layer DEL1, a second dummy emission layer DEL2, and a third dummy emission layer DEL3 may be disposed in each of the first to fourth island patterns ISP1, ISP2, ISP3, and ISP4 in the first dummy area DMA1.

The first dummy emission layer DEL1 may include substantially a same material as a first display emission layer EL1 of the first light emitting unit ELU1. The second dummy emission layer DEL2 may include substantially a same material as a second display emission layer of the second light emitting unit ELU2. The third dummy emission layer DEL3 may include substantially a same material as a third display emission layer of the third light emitting unit ELU3.

The first dummy emission layer DEL1, the second dummy emission layer DEL2, and the third dummy emission layer DEL3 may be arranged in the first direction DR1. The first dummy emission layer DEL1 may be disposed on one side of the second dummy emission layer DEL2, and the third dummy emission layer DEL3 may be disposed on another side (or an opposing side) of the second dummy emission layer DEL2. An area of the second dummy emission layer DEL2 may be greater than an area of the first dummy emission layer DEL1 and an area of the third dummy emission layer DEL3.

In an embodiment, as illustrated in FIGS. 9 and 10, the second dummy emission layer DEL2 overlaps the scan initialization lines GILk/GILk+1, the scan write lines GWLk/GWLk+1, the emission lines EMLk/EMLk+1, and the first power connection line VSCL and the first dummy emission layer DEL1, the second dummy emission layer DEL2, and the third dummy emission layer DEL3 overlap the first power line VSL, but an embodiment of the disclosure is not limited thereto. At least one selected from the first dummy emission layer DEL1, the second dummy emission layer DEL2, and the third dummy emission layer DEL3 may overlap at least one selected from the scan initialization lines GILk/GILk+1, the scan write lines GWLk/GWLk+1, the emission lines EMLk/EMLk+1, the first power connection line VSCL, the red data lines RDLj/RDLj+1/RDLj+2/RDLj+3, the blue data lines BDLj/BDLj+1/BDLj+2/BDLj+3, and the green data lines GDLj/GDLj+1/GDLj+2/GDLj+3.

The second common connection electrode CCU2 may be disposed in each of the first to fourth island patterns ISP1, ISP2, ISP3, and ISP4 in the first dummy area DMA1. In the first dummy area DMA1, a dummy common electrode DCE of each of the first to fourth island patterns ISP1, ISP2, ISP3, and ISP4 may be connected to the second common connection electrode CCU2 through a third common contact hole CCNT3. In the first dummy area DMA1, the second common connection electrode CCU2 of each of the first to fourth island patterns ISP1, ISP2, ISP3, and ISP4 may be connected to the first power line VSL through the fourth common contact hole CCNT4. Although not illustrated in FIGS. 9 to 11, the first power connection line VSCL may overlap the second common connection electrode CCU2 and the fourth common contact hole CCNT4 in the third direction DR3. Therefore, the first power voltage of the first power line VSL may be supplied to the dummy common electrode DCE through the first power connection line VSCL and the second common connection electrode CCU2.

The second common connection electrode CCU2 may be disposed in or directly on a same layer as the first pixel electrode PXE1, the second pixel electrode PXE2, the third pixel electrode PXE3, and the first common connection electrode CCU1. The second common connection electrode CCU2 may not overlap the first dummy emission layer DEL1, the second dummy emission layer DEL2, and the third dummy emission layer DEL3.

In an embodiment, as illustrated in FIGS. 9 to 11, in the first dummy area DMA1 as well as the display area DA, shapes of the first to fourth island patterns ISP1 to ISP4 do not change and lengths of the first to eighth connection patterns CNP1 to CNP8 change, such that a width of each of the cutout parts CUP1 to CUP4 may be adjusted. Therefore, the first dummy area DMA1 may be effectively stretched and contracted.

In such an embodiment, as illustrated in FIGS. 9 to 11, the first power line VSL may overlap the first dummy emission layer DEL1, the second dummy emission layer DEL2, and the third dummy emission layer DEL3 and extend in a zigzag or winding form along the second direction DR2, in the first dummy area DMA1. Since the first power line VSL is not disposed at the edge of the display panel 100, a width of the non-display area NDA may be decreased as compared with a case where the first power line VSL is disposed at the edge of the display panel 100.

In such an embodiment, the second dummy area DMA2 is substantially the same as the first dummy area DMA1 described above with reference to FIGS. 9 to 11, and thus, any repetitive detailed description of the second dummy area DMA2 will be omitted.

Figure 12:
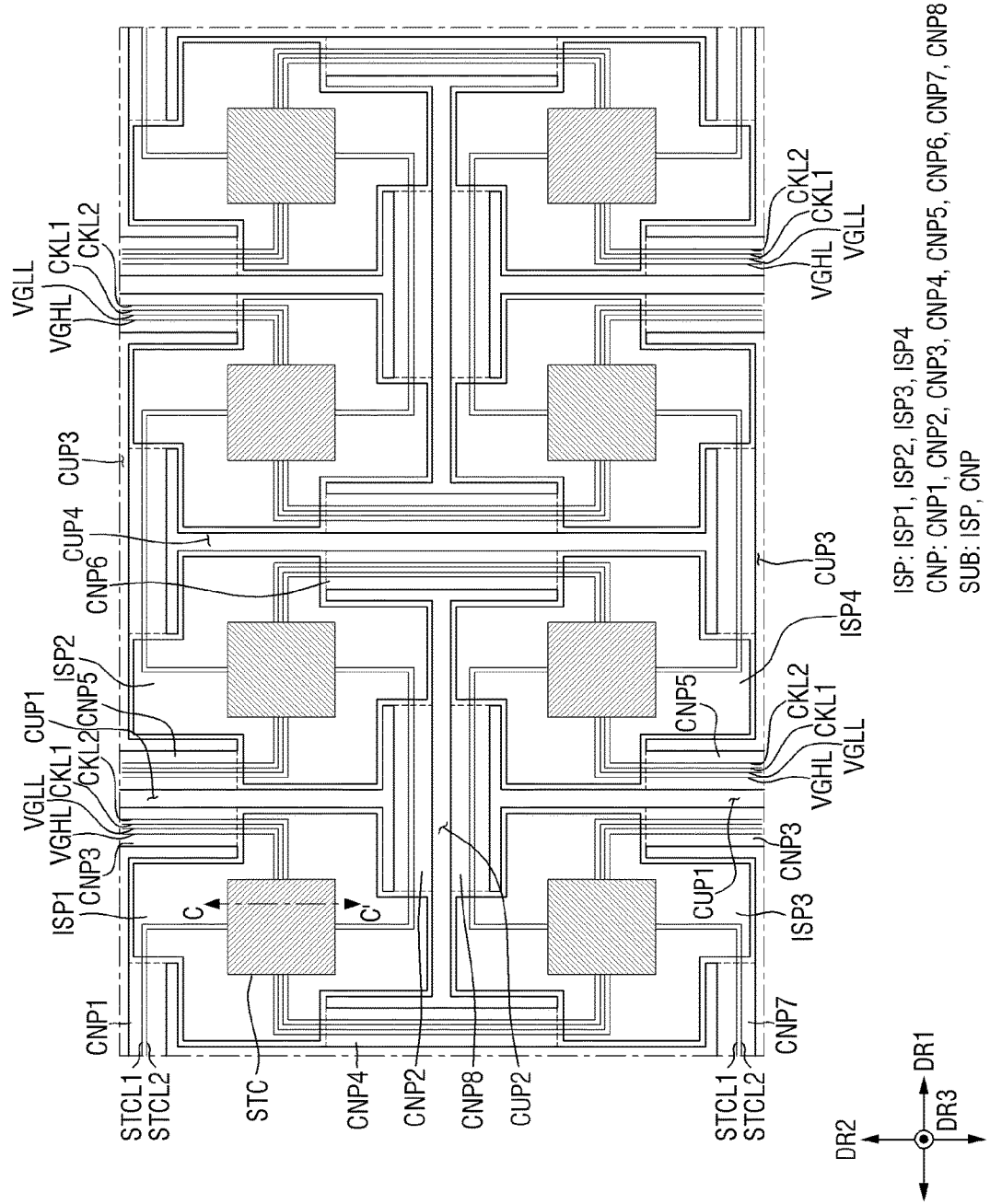
FIGS. 12 and 13 are plan views illustrating the first scan driver according to an embodiment in detail.
Figure 13:
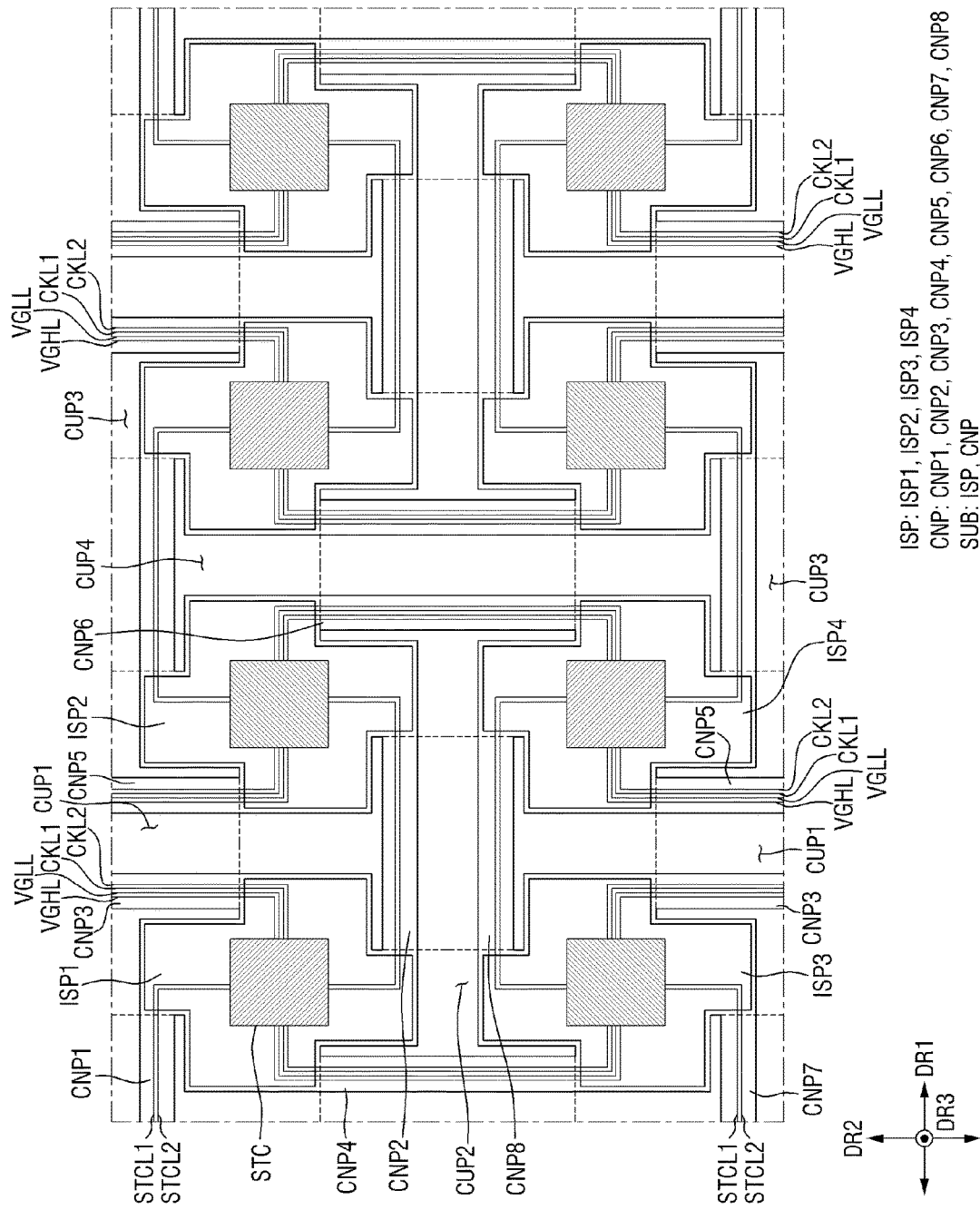

FIGS. 12 and 13 are plan views illustrating the first scan driver according to an embodiment in detail.

In FIG. 12, island patterns ISP1 to ISP4, connection patterns CNP1 to CNP8, and cutout parts CUP1 to CUP4 of the first scan driver SDC1 when the display device 10 is contracted are illustrated. In FIG. 13, island patterns ISP1 to ISP4, connection patterns CNP1 to CNP8, and cutout parts CUP1 to CUP4 of the first scan driver SDC1 when the display device 10 is stretched are illustrated.

Referring to FIGS. 12 and 13, the substrate SUB may include island patterns ISP and connection patterns CNP defined by the cutout parts CUP1 to CUP4 which are cut out in the first scan driver SDC1. The island patterns ISP and the connection patterns CNP of the first scan driver SDC1 may be substantially the same as the island patterns ISP and the connection patterns CNP of the display area DA described above with reference to FIGS. 4 and 5. Therefore, any repetitive detailed description of the island patterns ISP and the connection patterns CNP of the first scan driver SDC1 will be omitted.

A scan stage circuit unit STC may be disposed in each of the first to fourth island patterns ISP1, ISP2, ISP3, and ISP4 in the first scan driver SDC1. The scan stage circuit unit STC may include at least one of a plurality of thin film transistors of each of the plurality of stages STA1, STA2, STA3, STA4, . . . , STAm−1, STAm, and STAm+1 of the scan signal output unit SOU.

A first driving voltage line VGHL, a second driving voltage line VGLL, the first clock line CKL1, the second clock line CKL2, and stage connection lines STCL1 and STCL2, and the like, may be disposed in each of the first to fourth island patterns ISP1, ISP2, ISP3, and ISP4 in the first scan driver SDC1. The first scan control lines GCL1 (see FIG. 1) and the second scan control lines GCL2 (see FIG. 1) may include the first driving voltage line VGHL, the second driving voltage line VGLL, the first clock line CKL1, and the second clock line CKL2.

The first driving voltage line VGHL, the second driving voltage line VGLL, the first clock line CKL1, and the second clock line CKL2 may be connected to the scan stage circuit unit STC in each of the first to fourth island patterns ISP1, ISP2, ISP3, and ISP4. The first driving voltage line VGHL, the second driving voltage line VGLL, the first clock line CKL1, and the second clock line CKL2 may sequentially pass through the third connection pattern CNP3, the first island pattern ISP1, the fourth connection pattern CNP4, and the third island pattern ISP3. The first driving voltage line VGHL, the second driving voltage line VGLL, the first clock line CKL1, and the second clock line CKL2 may sequentially pass through the fifth connection pattern CNP5, the second island pattern ISP2, the sixth connection pattern CNP6, and the fourth island pattern ISP4. That is, the first driving voltage line VGHL, the second driving voltage line VGLL, the first clock line CKL1, and the second clock line CKL2 may extend in a zigzag or winding form along the second direction DR2.

The stage connection lines STCL1 and STCL2 may connect the scan stage circuit units STC adjacent to each other in the first direction DR1 to each other. The stage connection lines STCL1 and STCL2 may sequentially pass through the first connection pattern CNP1, the first island pattern ISP1, the second connection pattern CNP2, and the second island pattern ISP2. The stage connection lines STCL1 and STCL2 may sequentially pass through the seventh connection pattern CNP7, the third island pattern ISP3, the eighth connection pattern CNP8, and the fourth island pattern ISP4. That is, the stage connecting lines STCL1 and STCL2 may extend in a zigzag or winding form along the first direction DR1.

In addition, at least one of the scan initialization lines GILk/GILk+1, the scan writing lines GWLk/GWLk+1, and the emission lines EMLk/EMLk+1 as well as the stage connection lines STCL1 and STCL2 may sequentially pass through the first connection pattern CNP1, the first island pattern ISP1, the second connection pattern CNP2, and the second island pattern ISP2, and sequentially pass through the seventh connection pattern CNP7, the third island pattern ISP3, the eighth connection pattern CNP8, and the fourth island pattern ISP4. That is, at least one of the scan initialization lines GILk/GILk+1, the scan write lines GWLk/GWLk+1, and the emission lines EMLk/EMLk+1 may extend in a zigzag or winding form along the first direction DR1.

In an embodiment, as illustrated in FIGS. 12 and 13, in the first scan driver SDC1 as well as the display area DA and the first dummy area DMA1, shapes of the first to fourth island patterns ISP1 to ISP4 do not change and lengths of the first to eighth connection patterns CNP1 to CNP8 change, such that a width of each of the cutout parts CUP1 to CUP4 may be adjusted. Therefore, the first scan driver SDC1 may be effectively stretched and contracted.

In such an embodiment, the second scan driver SDC2 is substantially the same as the first scan driver SDC1 described with reference to FIGS. 12 and 13, and thus, any repetitive detailed description of the second scan driver SDC2 will be omitted.

Figure 14:
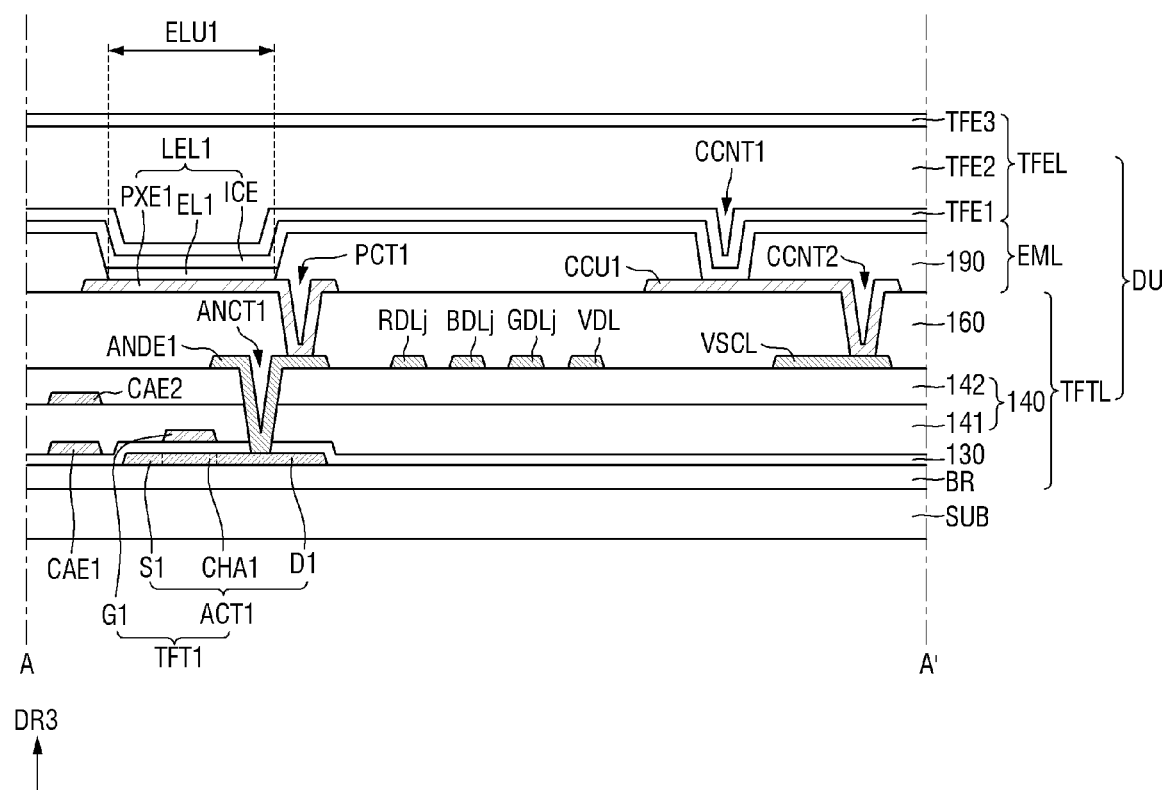
FIG. 14 is a cross-sectional view illustrating an embodiment of a display panel taken along line A-A' of FIG. 6.
Figure 15:
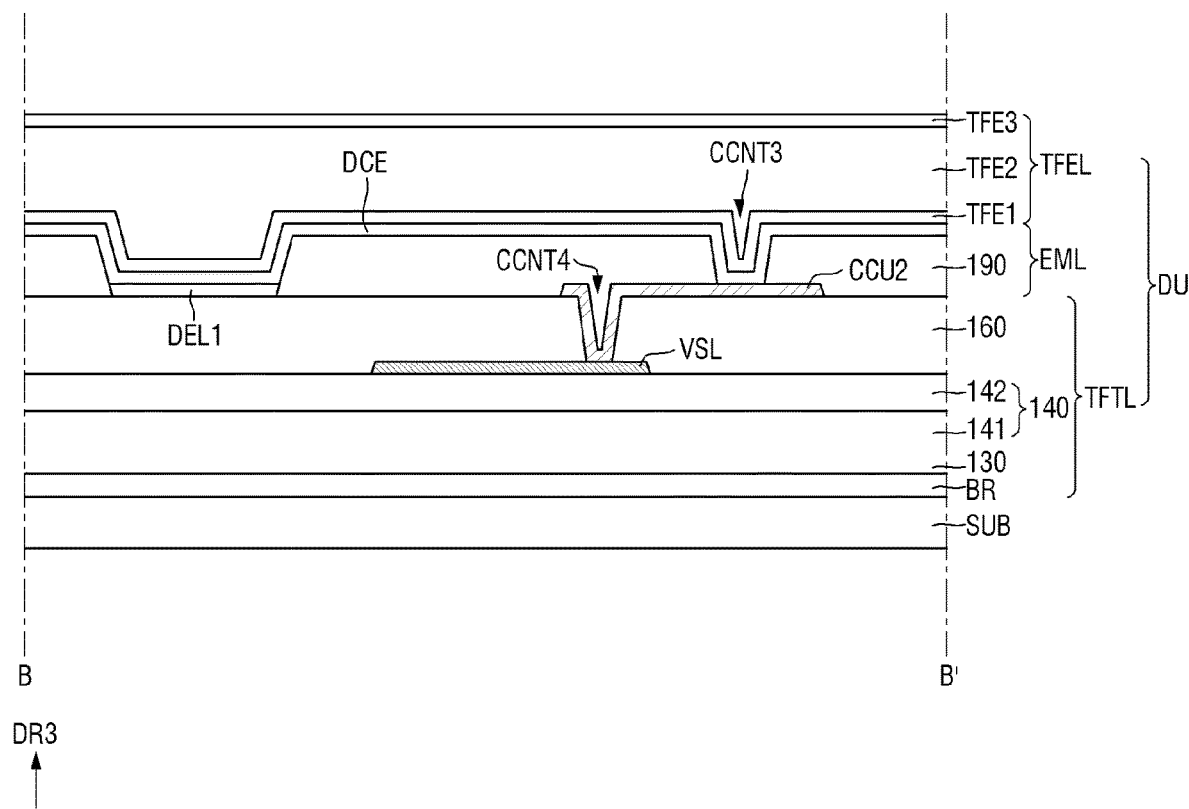
FIG. 15 is a cross-sectional view illustrating an embodiment of the display panel taken along line B-B' of FIG. 11.
Figure 16:
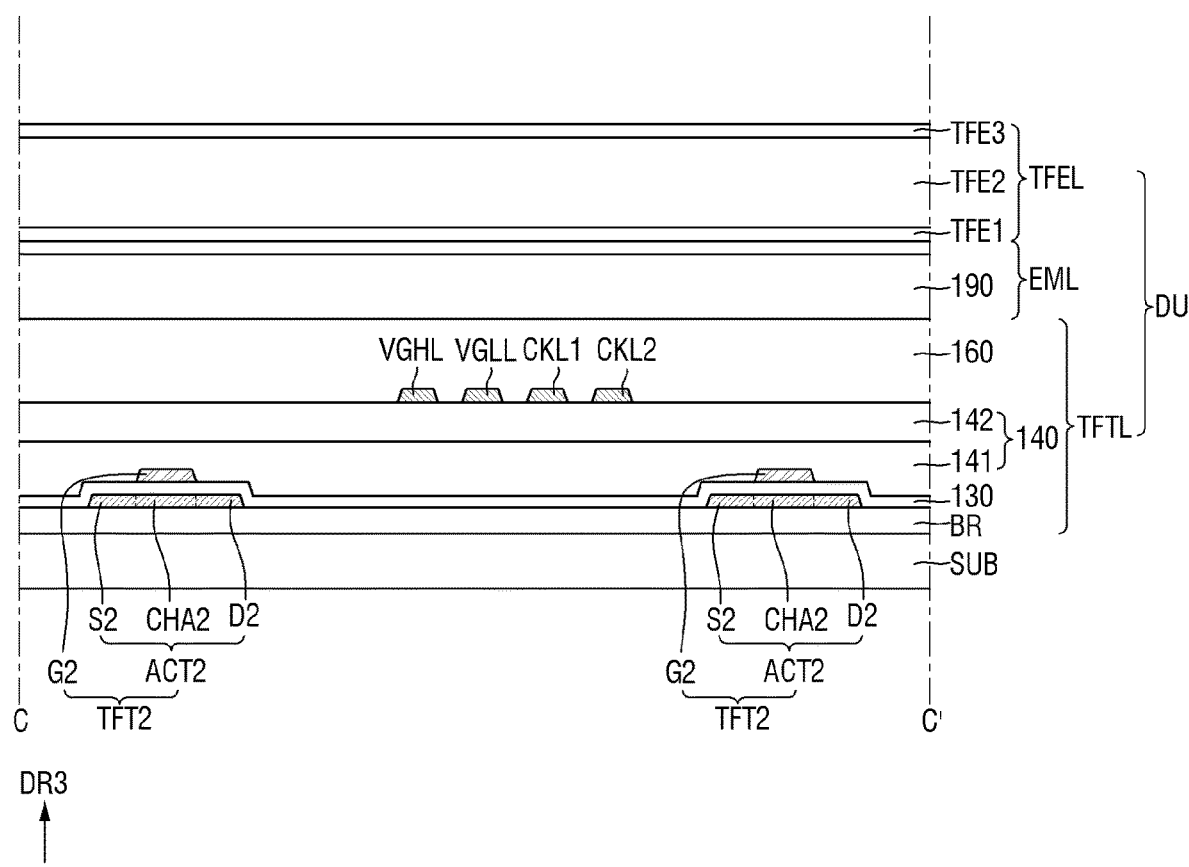
FIG. 16 is a cross-sectional view illustrating an embodiment of the display panel taken along line C-C' of FIG. 12.

FIG. 14 is a cross-sectional view illustrating an embodiment of a display panel taken along line A-A' of FIG. 6. FIG. 15 is a cross-sectional view illustrating an embodiment of the display panel taken along line B-B' of FIG. 11. FIG. 16 is a cross-sectional view illustrating an embodiment of the display panel taken along line C-C' of FIG. 12.

Referring to FIGS. 14 to 16, the substrate SUB may include or be made of an insulating material such as a polymer resin. In an embodiment, for example, the substrate SUB may include or be made of polyimide. The substrate SUB may be a flexible substrate that may be bent, folded, and rolled.

A barrier layer BR may be disposed on the substrate SUB. The barrier layer BR is a film for protecting transistors of a thin film transistor layer TFTL and display emission layers EL1 of a light emitting element layer EML from moisture permeating through the substrate SUB vulnerable to moisture permeation. In an embodiment, for example, the barrier layer BR may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may be zinc oxide (ZnO) and/or zinc peroxide ($ZnO_2$). The barrier layer BR may include or defined by a plurality of inorganic films.

A first thin film transistor TFT1 and a second thin film transistor TFT2 may be disposed on the barrier layer BR. The first thin film transistor TFT1 may be one of the fourth transistor ST4 and the sixth transistor ST6 illustrated in FIG. 2. The second thin film transistor TFT2 may be one of the plurality of thin film transistors of the scan stage circuit unit STC illustrated in FIG. 13. The first thin film transistor TFT1 may include a first active layer ACT1 and a first gate electrode G1. The second thin film transistor TFT2 may include the second active layer ACT2 and the second gate electrode G2.

The first active layer ACT1 of the first thin film transistor TFT1 and the second active layer ACT2 of the second thin film transistor TFT2 may be disposed on the barrier layer BR. The first active layer ACT1 and the second active layer ACT2 may include polycrystalline silicon, single crystal silicon, low-temperature polycrystalline silicon, amorphous silicon, or an oxide semiconductor.

The first active layer ACT1 may include a first channel region CHA1, a first source region S1, and a first drain region D1. The first channel region CHA1 may be a region overlapping the first gate electrode G1 in the third direction DR3, which is a thickness direction of the substrate SUB. The first source region S1 may be disposed on one side of the first channel region CHAT, and the first drain region D1 may be disposed on another side (or an opposing side) of the first channel region CHA1. The first source region S1 and the first drain region D1 may be regions that do not overlap the first gate electrode G1 in the third direction DR3. The first source region S1 and the first drain region D1 may be regions having conductivity by doping a silicon semiconductor or an oxide semiconductor with ions or impurities.

The second active layer ACT2 may include a second channel region CHA2, a second source region S2, and a second drain region D2. The second channel region CHA1 may be a region overlapping the second gate electrode G2 in the third direction DR3, which is the thickness direction of the substrate SUB. The second source region S2 may be disposed on one side of the second channel region CHA2, and the second drain region D2 may be disposed on another side (or an opposing side) of the second channel region CHA2. The second source region S2 and the second drain region D2 may be regions that do not overlap the second gate electrode G2 in the third direction DR3. The second source region S2 and the second drain region D2 may be regions having conductivity by doping a silicon semiconductor or an oxide semiconductor with ions or impurities.

A gate insulating layer 130 may be disposed on the first active layer ACT1 of the first thin film transistor TFT1 and the second active layer TFT2 of the second thin film transistor ACT2. The gate insulating layer 130 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The first gate electrode G1 of the first thin film transistor TFT1, the second gate electrode G2 of the second thin film transistor TFT2, and a first capacitor electrode CAE1 may be disposed on the gate insulating layer 130. The first gate electrode G1 may overlap the first active layer ACT1 in the third direction DR3. The second gate electrode G2 may overlap the second active layer ACT2 in the third direction DR3. It has been illustrated in FIG. 14 that the first gate electrode G1 and the first capacitor electrode CAE1 are disposed to be spaced apart from each other, but the first gate electrode G1 and the first capacitor electrode CAE1 may be connected to each other. Each of the first gate electrode G1, the second gate electrode G2, and the first capacitor electrode CAE1 may be formed as or defined by a single layer or multiple layers, each layer including or made of at least one selected from molybdenum (Mo), aluminum (Al), chromium (Cr), gold (Au), titanium (Ti), nickel (Ni), neodymium (Nd), and copper (Cu), or alloys thereof.

A first interlayer insulating layer 141 of an interlayer insulating layer 140 may be disposed on the first gate electrode G1 of the first thin film transistor TFT1, the second gate electrode G2 of the second thin film transistor TFT2, and the first capacitor electrode CAE1. The first interlayer insulating layer 141 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The first interlayer insulating layer 141 may include or defined by a plurality of inorganic films.

A second capacitor electrode CAE2 may be disposed on the first interlayer insulating layer 141. The second capacitor electrode CAE2 may overlap the first capacitor electrode CAE1 in the third direction DR3. In an embodiment where the first capacitor electrode CAE1 is connected to the first gate electrode G1, the second capacitor electrode CAE2 may overlap the first gate electrode G1 in the third direction DR3. Since the first interlayer insulating layer 141 has a predetermined dielectric constant, a capacitor may be formed by the first capacitor electrode CAE1, the second capacitor electrode CAE2, and the first interlayer insulating layer 141 disposed between the first capacitor electrode CAE1 and the second capacitor electrode CAE2. The second capacitor electrode CAE2 may be formed as or defined by a single layer or multiple layers, each layer including or made of at least one selected from molybdenum (Mo), aluminum (Al), chromium (Cr), gold (Au), titanium (Ti), nickel (Ni), neodymium (Nd), and copper (Cu), or alloys thereof. A second interlayer insulating layer 142 of the interlayer insulating layer 140 may be disposed on the second capacitor electrode CAE2. The second interlayer insulating layer 142 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The second interlayer insulating layer 142 may include or defined by a plurality of inorganic films.

A first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2 may be disposed on the second interlayer insulating layer 142. The first anode connection electrode ANDE1 may be connected to the first drain region D1 of the first thin film transistor TFT1 through a first connection contact hole ANCT1 defined through the gate insulating layer 130, the first interlayer insulating layer 141, and the second interlayer insulating layer 142. The first anode connection electrode ANDE1, the data lines RDLj, BDLj, and GDLj, the first power line VSL, the first driving voltage line VGHL, the second driving voltage line VGLL, the first clock line CKL1, and the second clock line CKL2 may be formed as or defined by a single layer or multiple layers, each layer including or made of at least one selected from molybdenum (Mo), aluminum (Al), chromium (Cr), gold (Au), titanium (Ti), nickel (Ni), neodymium (Nd), and copper (Cu), or alloys thereof.

A first planarization layer 160 for planarizing a step due to the first thin film transistor TFT1 and the second thin film transistor TFT2 may be disposed on the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2. The first planarization layer 160 may be formed as or defined by an organic film including or made of an acryl resin, an epoxy resin, a phenolic resin, a polyamide resin, a polyimide resin, or the like.

First light emitting elements LEL1, the first common connection electrode CCU1, the second common connection electrode CCU2, and a bank 190 may be disposed on the first planarization layer 160. The first light emitting element LEL1 includes the first pixel electrode PXE1, the first display emission layer EL1, and the island common electrode ICE.

The first pixel electrode PXE1, the first common connection electrode CCU1, and the second common connection electrode CCU2 may be disposed on the first planarization layer 160. The first pixel electrode PXE1 may be connected to the first anode connection electrode ANDE1 through a first pixel contact hole PCT1 defined through the first planarization layer 160. The first common connection electrode CCU1 may be connected to the first power connection line VSCL through the second common contact hole CCNT2 defined through the first planarization layer 160. The second common connection electrode CCU2 may be connected to the first power line VSL through the fourth common contact hole CCNT4 defined through the first planarization layer 160.

Each of the first pixel electrode PXE1, the first common connection electrode CCU1, and the second common connection electrode CCU2 may include or be formed of a metal material having high reflectivity, such as a stacked structure (Ti/Al/Ti) of aluminum and titanium, a stacked structure (ITO/Al/ITO) of aluminum and indium tin oxide ("ITO"), an APC alloy, and a stacked structure (ITO/APC/ITO) of an APC alloy and ITO. The APC alloy is an alloy of silver (Ag), palladium (Pd), and copper (Cu).

The bank 190 may be formed to partition the first pixel electrodes PXE1 on the first planarization layer 160, to define the first light emitting unit ELU1, the second light emitting unit ELU2, and the third light emitting unit ELU3. The bank 190 may be disposed to cover an edge of each of the pixel electrodes PXE1. The bank 190 may be formed as or defined by an organic film including or made of an acryl resin, an epoxy resin, a phenolic resin, a polyamide resin, a polyimide resin, or the like.

The first light emitting unit ELU1 refers to an area in which the first pixel electrode PXE1, the first display emission layer EL1, and the island common electrode ICE are sequentially stacked one on another and holes from the first pixel electrode PXE1 and electrons from the island common electrode ICE are recombined with each other in the first display emission layer EL1 to emit light.

The first display emission layer EL1 may be disposed on the first pixel electrode PXE1. The display emission layer EL1 may include an organic material to emit light of a predetermined color. In an embodiment, for example, the display emission layer EL1 includes a hole transporting layer, an organic material layer, and an electron transporting layer.

The second light emitting unit ELU2 may be an area in which the second pixel electrode, the second display emission layer, and the island common electrode are sequentially stacked one on another, and the third light emitting unit ELU3 may be an area in which the third pixel electrode, the third display emission layer, and the island common electrode areas sequentially stacked one on another. The second light emitting unit ELU2 and the third light emitting unit ELU3 may be formed to be substantially the same as the first light emitting unit ELU1.

The second dummy emission layer DEL2 is not covered by the bank 190, and may be disposed on the exposed surface of the first planarization layer 160. The first dummy emission layer DEL1 and the third dummy emission layer DEL3 are also not covered by the bank 190, and may be disposed on the exposed surface of the first planarization layer 160. The first dummy emission layer DEL1 may include substantially the same material as the first display emission layer EL1 of the first light emitting unit ELU1. The second dummy emission layer DEL2 may include substantially the same material as the second display emission layer of the second light emitting unit ELU2. The third dummy emission layer DEL3 may include substantially a same material as the third display emission layer of the third light emitting unit ELU3. The island common electrode ICE may be disposed on the first display emission layer EL1, the second display emission layer, and the third display emission layer. The island common electrode ICE may be disposed to cover the first display emission layer EL1, the second display emission layer, and the third display emission layer. The island common electrode ICE may be a common layer commonly disposed on the first display emission layer EL1, the second display emission layer, and the third display emission layer. A capping layer may be disposed on the island common electrode ICE. The island common electrode ICE may be connected to the first common connection electrode CCU1 through the first common contact hole CCNT1 defined through the bank 190. Accordingly, the first power voltage may be applied to the island common electrode ICE.

The dummy common electrode DCE may be disposed on the first dummy emission layer DEL1, the second dummy emission layer DEL2, and the third dummy emission layer DEL3. The dummy common electrode DCE may be disposed to cover the first dummy emission layer DEL1, the second dummy emission layer DEL2, and the third dummy emission layer DEL3. The dummy common electrode DCE may be a common layer commonly disposed on the first dummy emission layer DEL1, the second dummy emission layer DEL2, and the third dummy emission layer DEL3. A capping layer may be disposed on the dummy common electrode DCE. The dummy common electrode DCE may be connected to the second common connection electrode CCU2 through the third common contact hole CCNT3 defined through the bank 190. Accordingly, the first power voltage may be applied to the dummy common electrode DCE.

The island common electrode ICE and the dummy common electrode DCE may include or be formed of a transparent conductive material ("TCO") such as ITO or indium zinc oxide ("IZO") capable of transmitting light therethrough or a semi-transmissive conductive material such as magnesium (Mg), silver (Ag), or an alloy of magnesium (Mg) and silver (Ag). In an embodiment where the island common electrode ICE includes or is formed of the semi-transmissive conductive material, emission efficiency may be increased by a micro cavity.

An encapsulation layer TFEL may be disposed on the island common electrode ICE and the dummy common electrode DCE. The encapsulation layer TFEL includes at least one inorganic film to prevent oxygen or moisture from permeating into the light emitting element layer EML. In addition, the encapsulation layer TFEL includes at least one organic film to protect the light emitting element layer EML from foreign materials such as dust. In an embodiment, for example, the encapsulation layer TFEL includes a first encapsulation inorganic layer TFE1, an encapsulation organic film layer TFE2, and a second encapsulation inorganic layer TFE3.

The first encapsulation inorganic layer TFE1 may be disposed on the island common electrode ICE and the dummy common electrode DCE, the encapsulation organic film layer TFE2 may be disposed on the first encapsulation inorganic layer TFE1, and the second encapsulation inorganic layer TFE3 may be disposed on the encapsulation organic film layer TFE2. The first encapsulation inorganic layer TFE1 and the second encapsulation inorganic layer TFE3 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The encapsulation organic film layer TFE2 may be an organic film including or made of an acryl resin, an epoxy resin, a phenolic resin, a polyamide resin, a polyimide resin, or the like.

In an embodiment, although not illustrated in FIGS. 14 to 16, each of the first to eighth connection patterns CNP1 to CNP8 may be bent in the third direction DR3 as illustrated in FIG. 7 when the display device 10 is contracted. Therefore, the scan initialization lines GILk/GILk+1, the scan write lines GWLk/GWLk+1, the emission lines EMLk/EMLk+1, the first power connection line VSCL, the red data lines RDLj/RDLj+1/RDLj+2/RDLj+3, the blue data lines BDLj/BDLj+1/BDLj+2/BDLj+3, the green data lines GDLj/GDLj+1/GDLj+2/GDLj+3, and the second power line VDL disposed in each of the first to eighth connection patterns CNP1 to CNP8 may be disposed in or directly on a same layer as, for example, the second interlayer insulating layer 142 not to be damaged when the first to eighth connection patterns CNP1 to CNP8 are bent. In such an embodiment, an upper surface of the second interlayer insulating layer 142 on which the scan initialization lines GILk/GILk+1, the scan write lines GWLk/GWLk+1, the emission lines EMLk/EMLk+1, the first power connection line VSCL, the red data lines RDLj/RDLj+1/RDLj+2/RDLj+3, the blue data lines BDLj/BDLj+1/BDLj+2/BDLj+3, the green data lines GDLj/GDLj+1/GDLj+2/GDLj+3, and the second power line VDL/VDL+1/VDL+2/VDL+3 are disposed may be designed to be a neutral plane.

Figure 17:
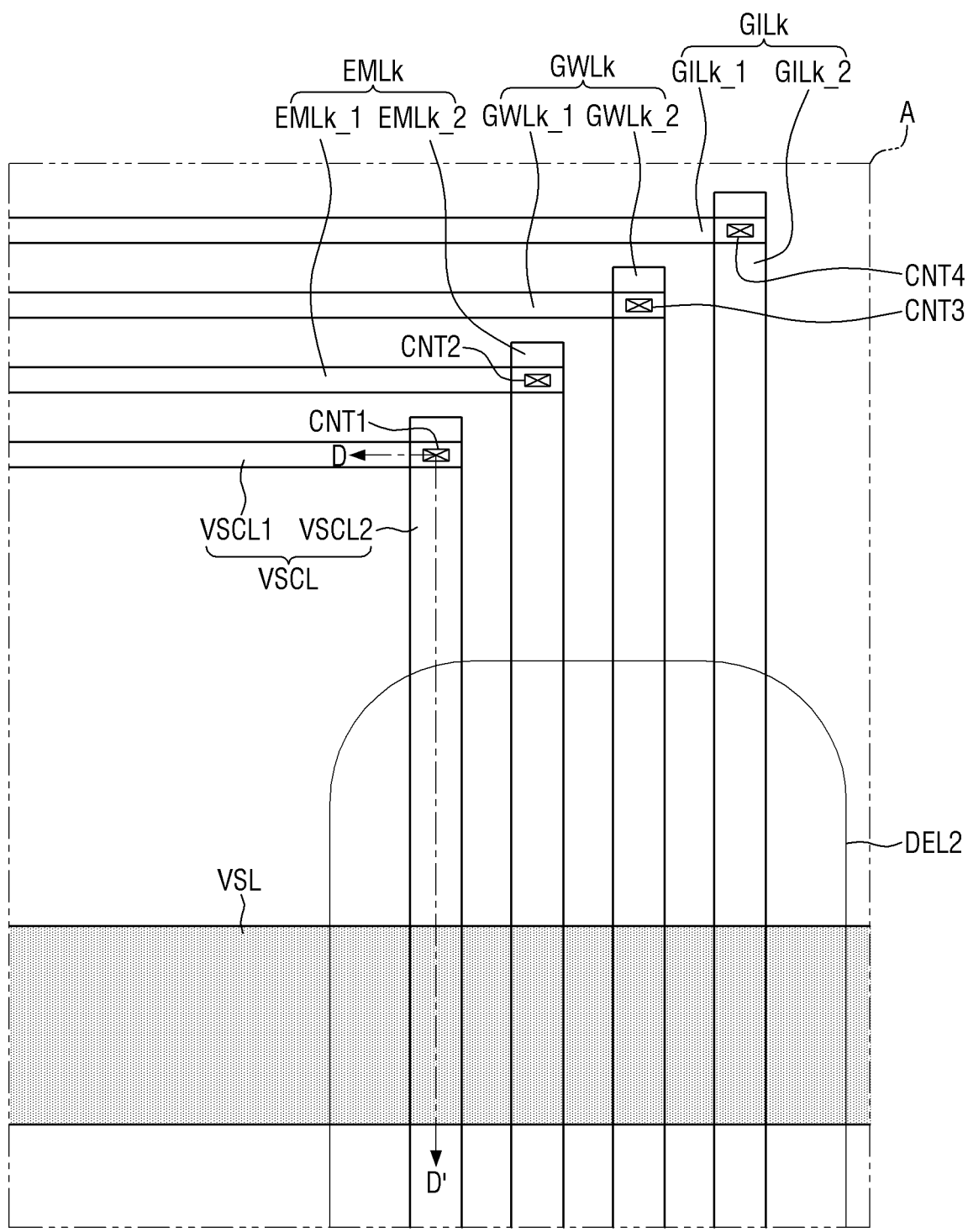
FIG. 17 is a plan view illustrating an embodiment of area A of FIG. 11 in detail.
Figure 18:
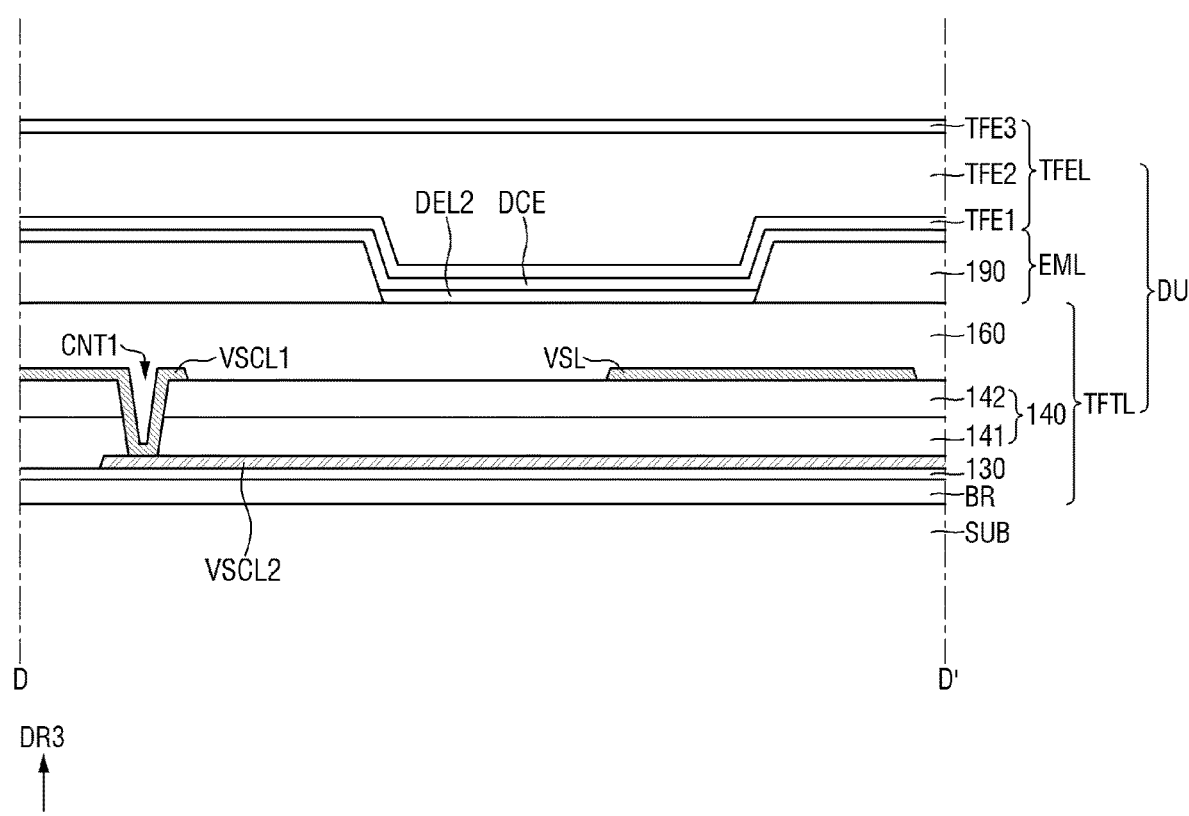
FIG. 18 is a cross-sectional view illustrating an embodiment of the display panel taken along line D-D' of FIG. 17.

FIG. 17 is a plan view illustrating an embodiment of area A of FIG. 11 in detail. FIG. 18 is a cross-sectional view illustrating an embodiment of the display panel taken along line D-D' of FIG. 17.

Referring to FIGS. 17 and 18, the first power connection line VSCL may include a first sub-power connection line VSCL1 and a second sub-power connection line VSCL2. The first sub-power connection line VSCL1 may be disposed in the first island pattern ISP1 and the first connection pattern CNP1, and the second sub-power connection line VSCL2 may be disposed in the first island pattern ISP1.

The first sub-power connection line VSCL1 may be disposed on the second interlayer insulating layer 142. In such an embodiment, the first sub-power connection line VSCL1 may be disposed in or directly on a same layer as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2. In addition, the first sub-power connection line VSCL1 may include the same material as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2.

The second sub-power connection line VSCL2 may be disposed on the gate insulating layer 130. In such an embodiment, the second sub-power connection line VSCL2 may be disposed in or directly on a same layer as the first gate electrode G1 of the first thin film transistor TFT1, the second gate electrode G2 of the second thin film transistor TFT2, and the first capacitor electrode CAE1. In addition, the second sub-power connection line VSCL2 may include the same material as the first gate electrode G1 of the first thin film transistor TFT1, the second gate electrode G2 of the second thin film transistor TFT2, and the first capacitor electrode CAE1.

The first sub-power connection line VSCL1 may be connected to the second sub-power connection line VSCL2 through a first contact hole CNT1 defined through the first interlayer insulating layer 141 and the second interlayer insulating layer 142 in the first island pattern ISP1. Since the second sub-power connection line VSCL2 is disposed on the gate insulating layer 130 and the first power line VSL is disposed on the second interlayer insulating layer 142, the second sub-power connection line VSCL2 and the first power line VSL may cross each other. Since a space of the first island pattern ISP1 is wider than a space of the first connection pattern CNP1, a width of the second sub-power connection line VSCL2 may be greater than a width of the first sub-power connection line VSCL1.

The k-th emission line EMLk may include a (k−1)-th emission line EMLk_1 and a (k−2)-th emission line EMLk_2. The (k−1)-th emission line EMLk_1 may be disposed in the first island pattern ISP1 and the first connection pattern CNP1, and the (k−2)-th emission line EMLk_2 may be disposed in the first island pattern ISP1.

The (k−1)-th emission line EMLk_1 may be disposed on the second interlayer insulating layer 142. In such an embodiment, the (k−1)-th emission line EMLk_1 may be disposed in or directly on a same layer as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2. In addition, the (k−1)-th emission line EMLk_1 may include a same material as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2.

The (k−2)-th emission line EMLk_2 may be disposed on the gate insulating layer 130. In such an embodiment, the (k−2)-th emission line EMLk_2 may be disposed in or directly on a same layer as the first gate electrode G1 of the first thin film transistor TFT1, the second gate electrode G2 of the second thin film transistor TFT2, and the first capacitor electrode CAE1. In addition, the (k−2)-th emission line EMLk_2 may include a same material as the first gate electrode G1 of the first thin film transistor TFT1, the second gate electrode G2 of the second thin film transistor TFT2, and the first capacitor electrode CAE1.

The (k−1)-th emission line EMLk_1 may be connected to the (k−2)-th emission line EMLk_2 through a second contact hole CNT2 defined through the first interlayer insulating layer 141 and the second interlayer insulating layer 142 in the first island pattern ISP1. Since the (k−2)-th emission line EMLk_2 is disposed on the gate insulating layer 130 and the first power line VSL is disposed on the second interlayer insulating layer 142, the (k−2)-th emission line EMLk_2 and the first power line VSL may cross each other. Since the space of the first island pattern ISP1 is wider than the space of the first connection pattern CNP1, a width of the (k−2)-th emission line EMLk_2 may be greater than a width of the (k−1)-th emission line EMLk_1.

The k-th scan write line GWLk may include a (k−1)-th scan write line GWLk_1 and a (k−2)-th scan write line GWLk_2. The (k−1)-th scan write line GWLk_1 may be disposed in the first island pattern ISP1 and the first connection pattern CNP1, and the (k−2)-th scan write line GWLk_2 may be disposed in the first island pattern ISP1.

The (k−1)-th scan write line GWLk_1 may be disposed on the second interlayer insulating layer 142. In such an embodiment, the (k−1)-th scan write line GWLk_1 may be disposed in or directly on a same layer as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2. In addition, the (k−1)-th scan write line GWLk_1 may include a same material as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2.

The (k−2)-th scan write line GWLk_2 may be disposed on the gate insulating layer 130. In such an embodiment, the (k−2)-th scan write line GWLk_2 may be disposed in or directly on a same layer as the first gate electrode G1 of the first thin film transistor TFT1, the second gate electrode G2 of the second thin film transistor TFT2, and the first capacitor electrode CAE1. In addition, the (k−2)-th scan write line GWLk_2 may include a same material as the first gate electrode G1 of the first thin film transistor TFT1, the second gate electrode G2 of the second thin film transistor TFT2, and the first capacitor electrode CAE1.

The (k−1)-th scan write line GWLk_1 may be connected to the (k−2)-th scan write line GWLk_2 through a third contact hole CNT3 defined through the first interlayer insulating layer 141 and the second interlayer insulating layer 142 in the first island pattern ISP1. Since the (k−2)-th scan write line GWLk_2 is disposed on the gate insulating layer 130 and the first power line VSL is disposed on the second interlayer insulating layer 142, the (k−2)-th scan write line GWLk_2 and the first power line VSL may cross each other. Since the space of the first island pattern ISP1 is wider than the space of the first connection pattern CNP1, a width of the (k−2)-th scan write line GWLk_2 may be greater than a width of the (k−1)-th scan write line GWLk_1.

The k-th scan initialization line GILk may include a (k−1)-th scan initialization line GILk_1 and a (k−2)-th scan initialization line GILk_2. The (k−1)-th scan initialization line GILk_1 may be disposed in the first island pattern ISP1 and the first connection pattern CNP1, and the (k−2)-th scan initialization line GILk_2 may be disposed in the first island pattern ISP1.

The (k−1)-th scan initialization line GILk_1 may be disposed on the second interlayer insulating layer 142. In such an embodiment, the (k−1)-th scan initialization line GILk_1 may be disposed in or directly on a same layer as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2. In addition, the (k−1)-th scan initialization line GILk_1 may include a same material as the first anode connection electrode ANDE1, the data lines RDLj, BDLj, and GDLj, the first power line VSL, the first power connection line VSCL, the first driving voltage line VGHL, the second driving voltage line VGLL, the first clock line CKL1, and the second clock line CKL2.

The (k−2)-th scan initialization line GILk_2 may be disposed on the gate insulating layer 130. In such an embodiment, the (k−2)-th scan initialization line GILk_2 may be disposed in or directly on a same layer as the first gate electrode G1 of the first thin film transistor TFT1, the second gate electrode G2 of the second thin film transistor TFT2, and the first capacitor electrode CAE1. In addition, the (k–2)-th scan initialization line GILk_2 may include a same material as the first gate electrode G1 of the first thin film transistor TFT1, the second gate electrode G2 of the second thin film transistor TFT2, and the first capacitor electrode CAE1.

The (k–1)-th scan initialization line GILk_1 may be connected to the (k–2)-th scan initialization line GILk_2 through a fourth contact hole CNT4 defined through the first interlayer insulating layer 141 and the second interlayer insulating layer 142 in the first island pattern ISP1. Since the (k–2)-th scan initialization line GILk_2 is disposed on the gate insulating layer 130 and the first power line VSL is disposed on the second interlayer insulating layer 142, the (k–2)-th scan initialization line GILk_2 and the first power line VSL may cross each other. Since the space of the first island pattern ISP1 is wider than the space of the first connection pattern CNP1, a width of the (k–2)-th scan initialization line GILk_2 may be greater than a width of the (k–1)-th scan initialization line GILk_1.

In such an embodiment, each of the stage connection lines STCL1 and STCL2 may be formed to be substantially the same as the first power connection line VSCL, the k-th emission line EMLk, the k-th scan write line GWLk, and the k-scan initialization line GILk described in connection with FIGS. 17 and 18. Therefore, any repetitive detailed description of the stage connecting lines STCL1 and STCL2 will be omitted.

Figure 19:
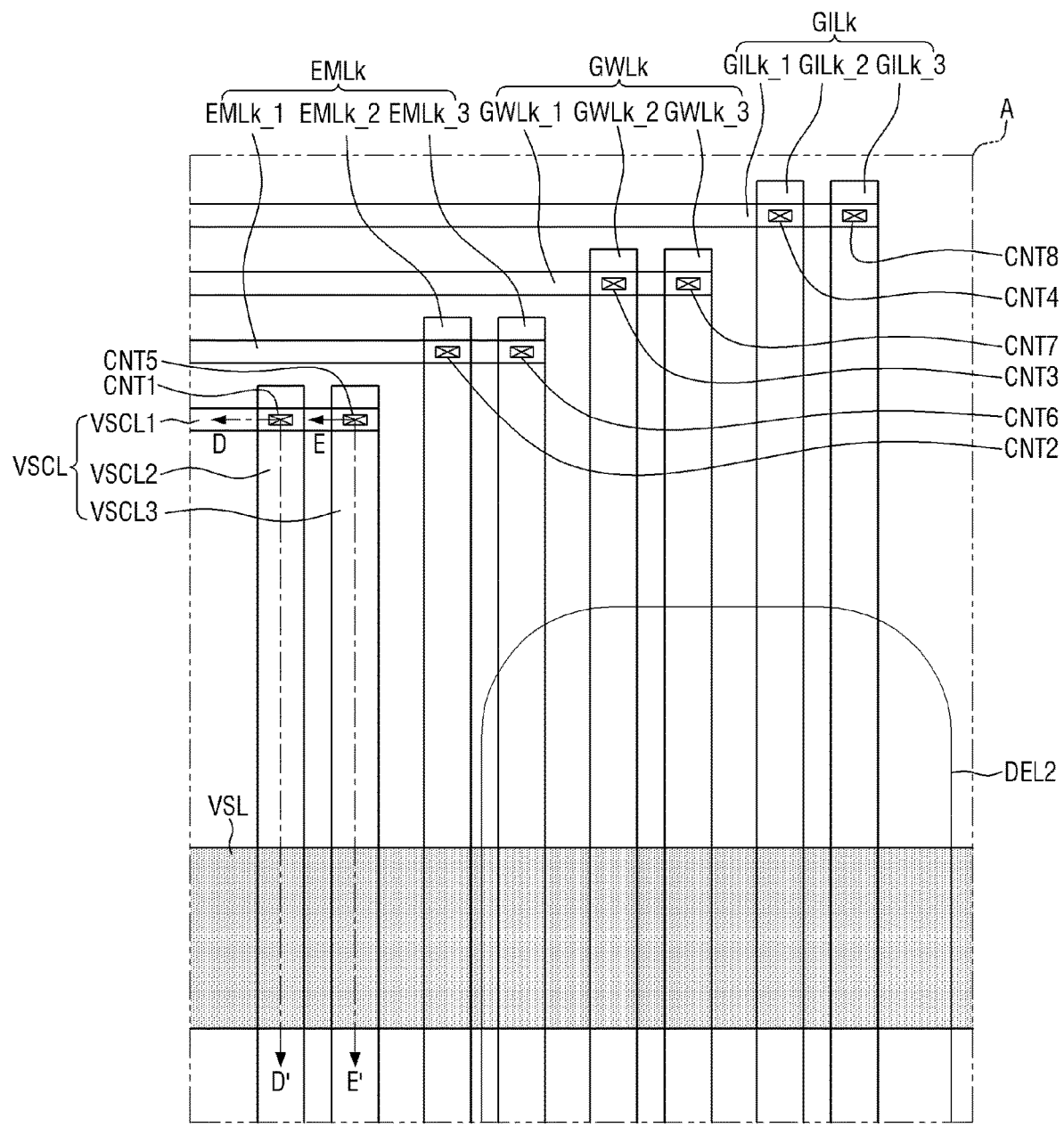
FIG. 19 is a plan view illustrating an alternative embodiment of area A of FIG. 11 in detail.
Figure 20:
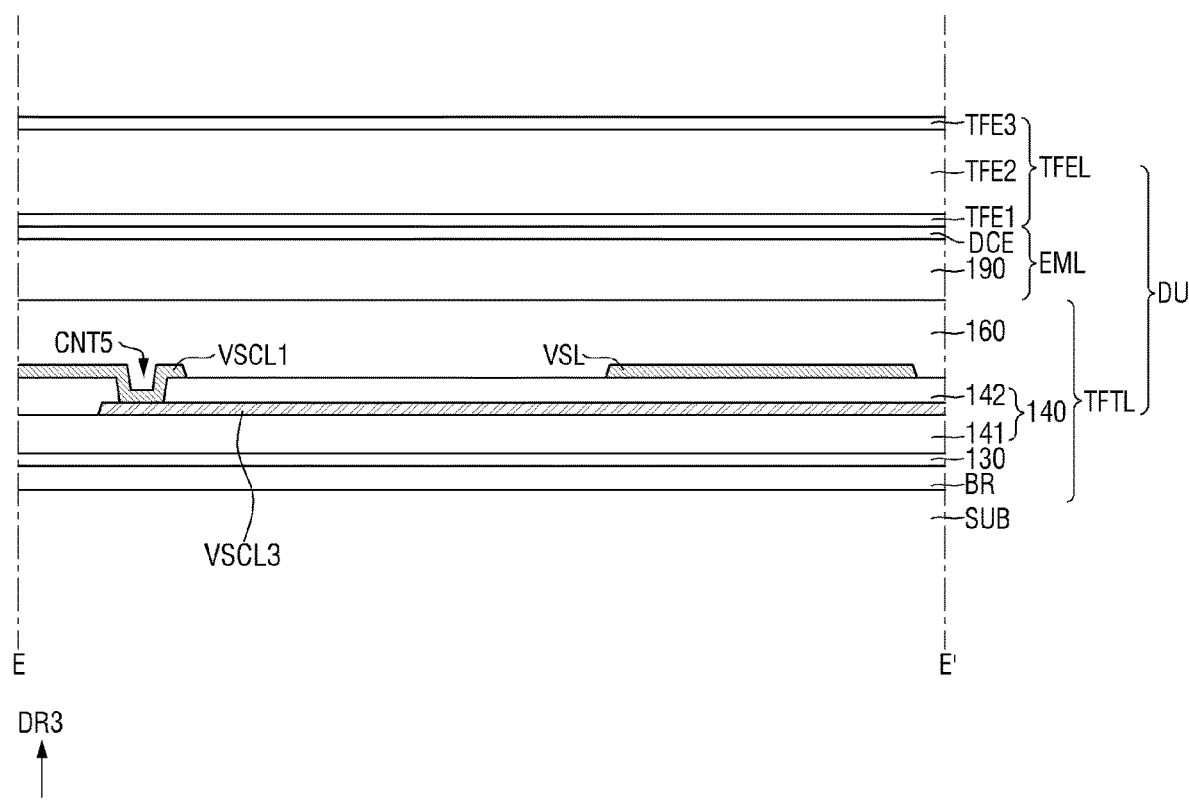
FIG. 20 is a cross-sectional view illustrating an embodiment of the display panel taken along line E-E' of FIG. 19.

FIG. 19 is a plan view illustrating an alternative embodiment of area A of FIG. 11 in detail. FIG. 20 is a cross-sectional view illustrating an embodiment of the display panel taken along line E-E' of FIG. 19.

An embodiment of FIGS. 19 and 20 is substantially the same as the embodiment of FIGS. 17 and 18 except that the first power connection line VSCL further includes a third sub-power connection line VSCL3, the k-th emission line EMLk further includes a (k–3)-th emission line EMLk_3, the k-th scan write line GWLk further includes a (k–3)-th scan write line GWLk_3, and the k-th initialization line GILk further includes a (k–3)-th scan initialization line GILk_3.

Referring to FIGS. 19 and 20, the third sub-power connection line VSCL3, the (k–3)-th emission line EMLk_3, the (k–3)-th scan write line GWLk_3, and the (k–3)-th scan initialization line GILk_3 may be disposed in the first island pattern ISP1. The third sub-power connection line VSCL3, the (k–3)-th emission line EMLk_3, the (k–3)-th scan write line GWLk_3, and the (k–3)-th scan initialization line GILk_3 may be disposed on the first interlayer insulating layer 141. In such an embodiment, the third sub-power connection line VSCL3, the (k–3)-th emission line EMLk_3, the (k–3)-th scan write line GWLk_3, and the (k–3)-th scan initialization line GILk_3 may be disposed in or directly on a same layer as the second capacitor electrode CAE2. In addition, the third sub-power connection line VSCL3, the (k–3)-th emission line EMLk_3, the (k–3)-th scan write line GWLk_3, and the (k–3)-th scan initialization line GILk_3 may include a same material as the second capacitor electrode CAE2.

The first sub-power connection line VSCL1 may be connected to the third sub-power connection line VSCL3 through a fifth contact hole CNT5 defined through the second interlayer insulating layer 142 in the first island pattern ISP1. Since the third sub-power connection line VSCL3 is disposed on first interlayer insulating layer 141 and the first power line VSL is disposed on the second interlayer insulating layer 142, the third sub-power connection line VSCL3 and the first power line VSL may cross each other.

Since the space of the first island pattern ISP1 is wider than the space of the first connection pattern CNP1, a width of the third sub-power connection line VSCL3 may be greater than a width of the first sub-power connection line VSCL1. In addition, since the space of the first island pattern ISP1 is wider than the space of the first connection pattern CNP1, the first sub-power connection line VSCL1 may be divided into two lines, that is, the second sub-power connection line VSCL2 and the third sub-power connection line VSCL3, and such two lines may cross the first power line VSL, in the first island pattern ISP1. Accordingly, resistance of the first power connection line VSCL may be decreased.

The (k–1)-th emission line EMLk_1 may be connected to the (k–3)-th emission line EMLk_3 through a sixth contact hole CNT6 defined through the second interlayer insulating layer 142 in the first island pattern ISP1. Since the (k–3)-th emission line EMLk_3 is disposed on the first interlayer insulating layer 141 and the first power line VSL is disposed on the second interlayer insulating layer 142, the (k–3)-th emission line EMLk_3 and the first power line VSL may cross each other.

Since the space of the first island pattern ISP1 is wider than the space of the first connection pattern CNP1, a width of the (k–3)-th emission line EMLk_3 may be greater than a width of the (k–1)-th emission line EMLk_1. In addition, since the space of the first island pattern ISP1 is wider than the space of the first connection pattern CNP1, the (k–1)-th emission line EMLk_1 may be divided into two lines, that is, the (k–2)-th emission line EMLk_2 and the (k–3)-th emission line EMLk_3 and such two lines may cross the first power line VSL, in the first island pattern ISP1. Accordingly, resistance of the k-th emission line EMLk may be decreased.

The (k–1)-th scan write line GWLk_1 may be connected to the (k–3)-th scan write line GWLk_3 through a seventh contact hole CNT7 defined through the second interlayer insulating layer 142 in the first island pattern ISP1. Since the (k–3)-th scan write line GWLk_3 is disposed on the first interlayer insulating layer 141 and the first power line VSL is disposed on the second interlayer insulating layer 142, the (k–3)-th scan write line GWLk_3 and the first power line VSL may cross each other.

Since the space of the first island pattern ISP1 is wider than the space of the first connection pattern CNP1, a width of the (k–3)-th scan write line GWLk_3 may be greater than a width of the (k–1)-th scan write line GWLk_1. In addition, since the space of the first island pattern ISP1 is wider than the space of the first connection pattern CNP1, the (k–1)-th scan write line GWLk_1 may be divided into two lines, that is, the (k–2)-th scan write line GWLk_2 and the (k–3)-th scan write line GWLk_3 and such two lines may cross the first power line VSL, in the first island pattern ISP1. Accordingly, resistance of the k-th scan write line GWLk may be decreased.

The (k–1)-th scan initialization line GILk_1 may be connected to the (k–3)-th scan initialization line GILk_3 through an eighth contact hole CNT8 defined through the second interlayer insulating layer 142 in the first island pattern ISP1. Since the (k–3)-th scan initialization line GILk_3 is disposed on the first interlayer insulating layer 141 and the first power line VSL is disposed on the second interlayer insulating layer 142, the (k–3)-th scan initialization line GILk_3 and the first power line VSL may cross each other.

Since the space of the first island pattern ISP1 is wider than the space of the first connection pattern CNP1, a width of the (k−3)-th scan initialization line GILk_3 may be greater than a width of the (k−1)-th scan initialization line GILk_1. In addition, since the space of the first island pattern ISP1 is wider than the space of the first connection pattern CNP1, the (k−1)-th scan initialization line GILk_1 may be divided into two lines, that is, the (k−2)-th scan initialization line GILk_2 and the (k−3)-th scan initialization line GILk_3 and such two lines may cross the first power line VSL, in the first island pattern ISP1. Accordingly, resistance of the k-th scan initialization line GILk may be decreased.

In such an embodiment, each of the stage connection lines STCL1 and STCL2 may be formed to be substantially the same as the first power connection line VSCL, the k-th emission line EMLk, the k-th scan write line GWLk, and the k-scan initialization line GILk described in connection with FIGS. 19 and 20. Therefore, any repetitive detailed description of the stage connecting lines STCL1 and STCL2 will be omitted.

Figure 21:
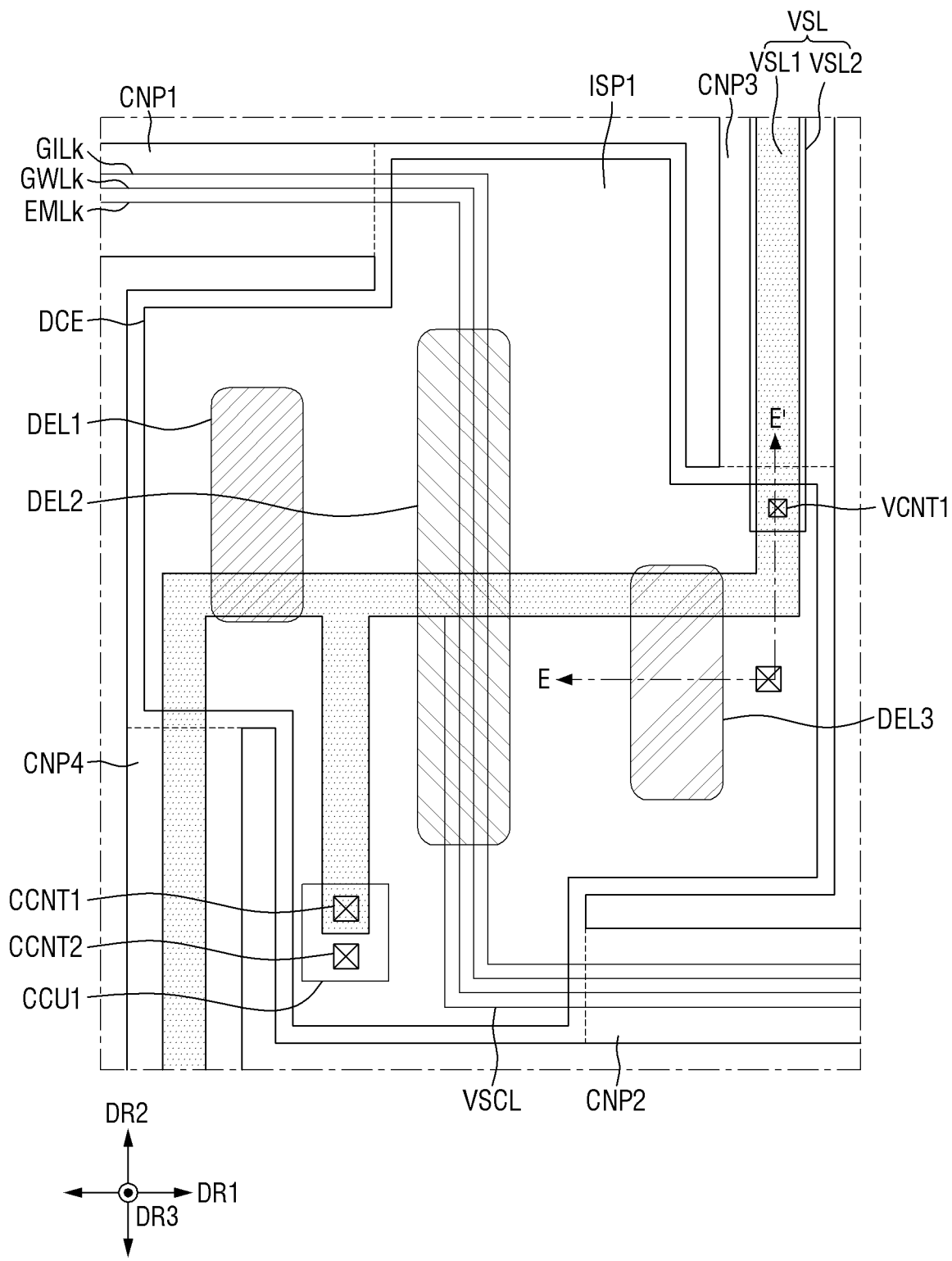
FIG. 21 is a plan view illustrating a first island pattern of a first dummy area according to an alternative embodiment in detail.
Figure 22:
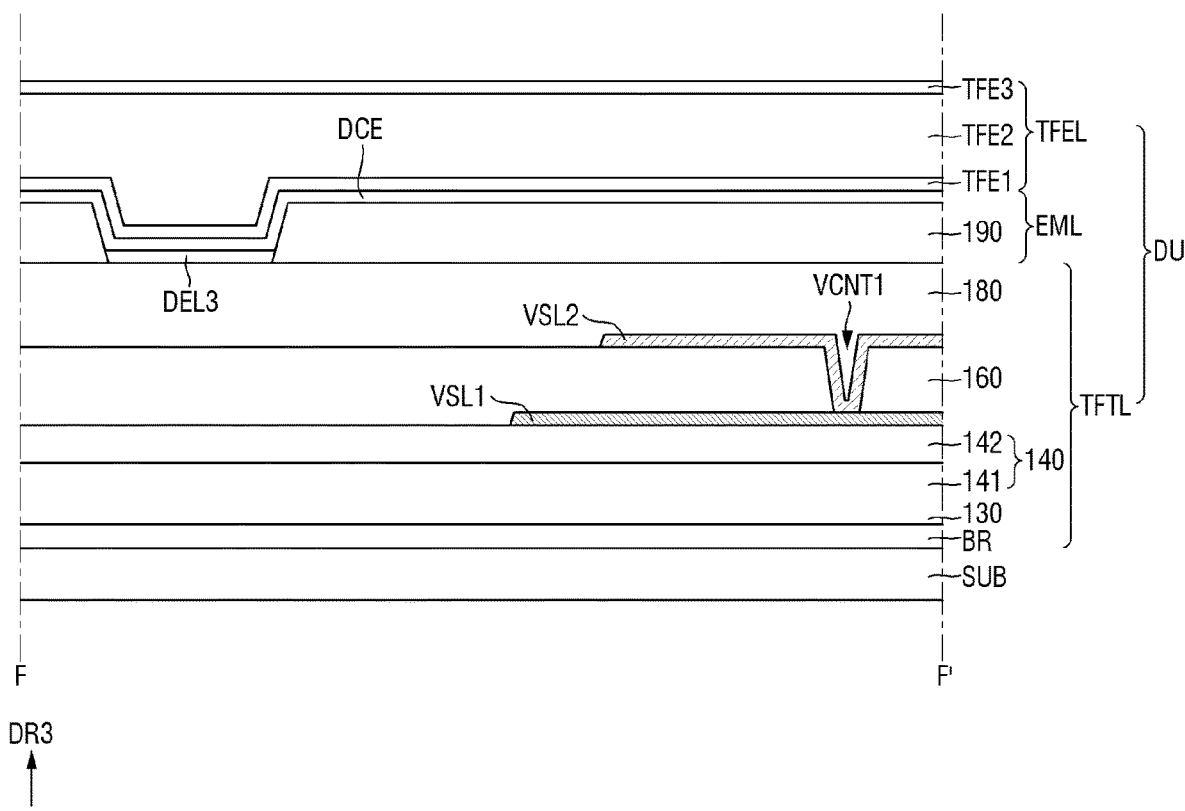
FIG. 22 is a cross-sectional view illustrating an embodiment of a display panel taken along line F-F' of FIG. 21.

FIG. 21 is a plan view illustrating a first island pattern of a first dummy area according to an alternative embodiment in detail. FIG. 22 is a cross-sectional view illustrating an embodiment of a display panel taken along line F-F' of FIG. 21.

An embodiment of FIGS. 21 and 22 is substantially the same as the embodiment of FIGS. 11 and 15 except that in the first dummy area DMA1, the first power line VSL includes a first sub-power line VSL1 and a second sub-power line VSL2.

Referring to FIGS. 21 and 22, the first sub-power line VSL1 may be disposed on the second interlayer insulating layer 142. In such an embodiment, the first sub-power line VSL1 may be disposed in or directly on a same layer as the first anode connection electrode ANDE1, the data lines RDLj, BDLj, and GDLj, the first power line VSL, and the first power connection line VSCL. In addition, the first sub-power line VSL1 may include a same material as the first anode connection electrode ANDE1, the data lines RDLj, BDLj, and GDLj, the first power line VSL, and the first power connection line VSCL.

The second sub-power line VSL2 may be disposed on the first planarization layer 160. The second sub-power line VSL2 may be formed as or defined by a single layer or multiple layers, each layer including or made of at least one selected from molybdenum (Mo), aluminum (Al), chromium (Cr), gold (Au), titanium (Ti), nickel (Ni), neodymium (Nd), and copper (Cu), or alloys thereof.

A second planarization layer 180 may be disposed on the second sub-power line VSL2. The second sub-power line VSL2 may be connected to the first sub-power line VSL1 through a first power contact hole VCNT1 defined through the first planarization layer 160 in the first island pattern ISP1. The second planarization layer 180 may be formed as or defined by an organic film including or made of an acryl resin, an epoxy resin, a phenolic resin, a polyamide resin, a polyimide resin, or the like.

In such an embodiment, the first light emitting element LEL1, the first common connection electrode CCU1, the second common connection electrode CCU2, and the bank 190 illustrated in FIG. 14 may be disposed on the second planarization layer 180. In addition, a second anode connection electrode may be disposed on the first planarization layer 160, and may be connected to the first anode connection electrode ANDE1 through a second connection contact hole defined through the first planarization layer 160. In addition, the first pixel electrode PXE1 of the first light emitting element LEL1 may be connected to the first anode connection electrode ANDE1 through a third connection contact hole defined through the second planarization layer 180.

In an embodiment, as illustrated in FIGS. 21 and 22, the second sub-power line VSL2 is disposed in the first island pattern ISP1, the first connection pattern CNP1, and the second connection pattern CNP2, but an embodiment of the disclosure is not limited thereto. In an alternative embodiment, for example, in the first connection pattern CNP1 and the second connection pattern CNP2, the second sub-power line VSL2 is disposed on a surface other than a neutral plane, and thus, a crack may occur in the second sub-power line VSL2 when the first connection pattern CNP1 and the second connection pattern CNP2 are bent. Therefore, the second sub-power line VSL2 may be disposed on the first island pattern ISP1 of which a change in shape does not exist or is minimized even though the display device 10 is contracted and stretched, and may not be disposed on the first connection pattern CNP1 and the second connection pattern CNP2.

In an embodiment, as illustrated in FIGS. 21 and 22, the first power line VSL includes the first sub-power line VSL1 and the second sub-power line VSL2 overlapping each other in the third direction DR3, such that an area of the first power line VSL may be increased as a compared with a length of the first power line VSL, and thus, resistance of the first power line VSL may be decreased.

In such an embodiment, a first power line VSL of the second dummy area DMA2 may be substantially the same as the first power line VSL illustrated in FIGS. 21 and 22, and thus, any repetitive detailed description of the first power line VSL of the second dummy area DMA2 will be omitted.

Figure 23:
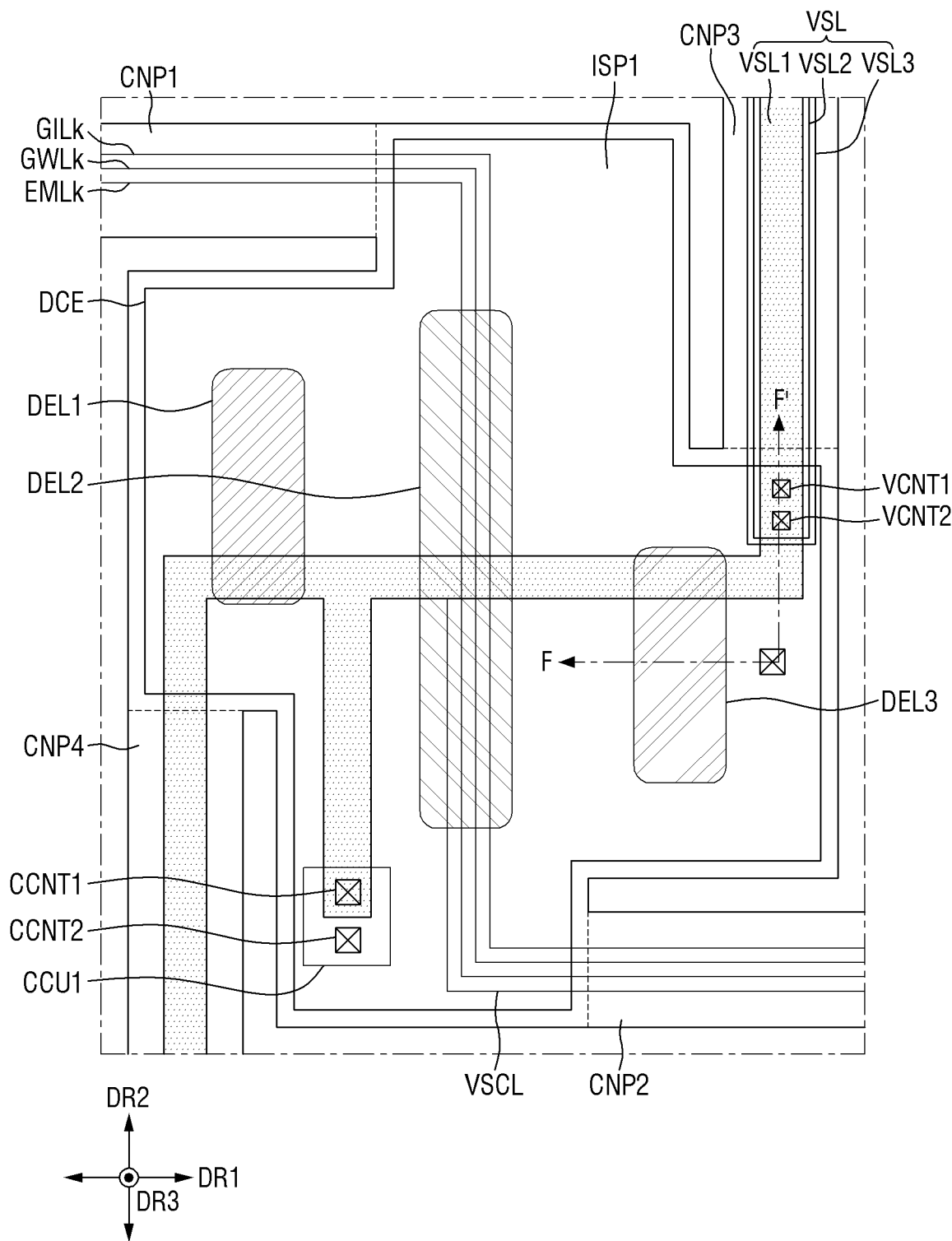
FIG. 23 is a plan view illustrating a first island pattern of a first dummy area according to another alternative embodiment in detail.
Figure 24:
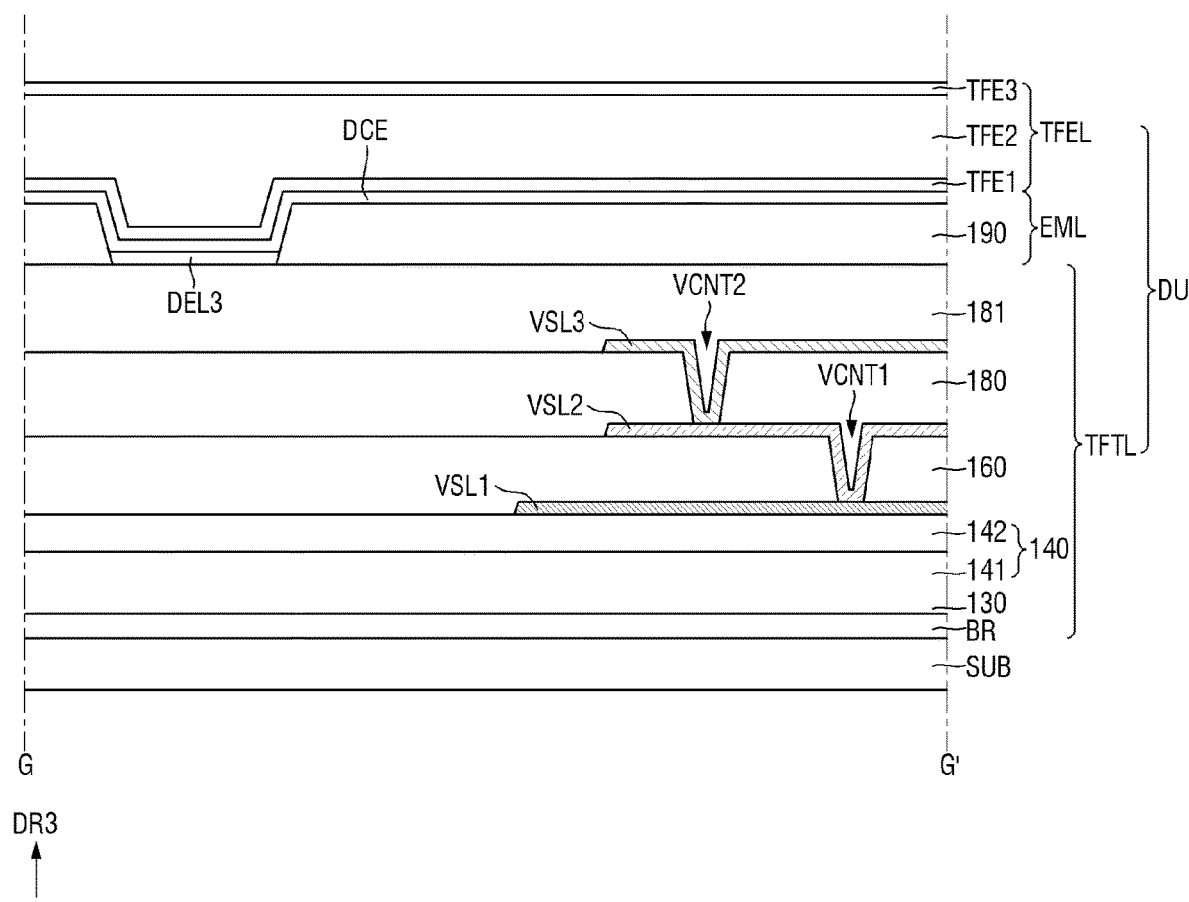
FIG. 24 is a cross-sectional view illustrating an embodiment of a display panel taken along line G-G' of FIG. 23.

FIG. 23 is a plan view illustrating a first island pattern of a first dummy area according to an alternative embodiment in detail. FIG. 24 is a cross-sectional view illustrating an embodiment of a display panel taken along line G-G' of FIG. 23.

Still another embodiment of FIGS. 23 and 24 is different from another embodiment of FIGS. 21 and 22 in that in the first dummy area DMA1, the first power line VSL further includes a third sub-power line VSL3.

Referring to FIGS. 23 and 24, the third sub-power line VSL3 may be disposed on the second planarization layer 180. The third sub-power line VSL3 may be formed as or defined by a single layer or multiple layers, each layer including or made of at least one selected from molybdenum (Mo), aluminum (Al), chromium (Cr), gold (Au), titanium (Ti), nickel (Ni), neodymium (Nd), and copper (Cu), or alloys thereof.

A third planarization layer 181 may be disposed on the third sub-power line VSL3. The third sub-power line VSL3 may be connected to the second sub-power line VSL2 through a second power contact hole VCNT2 defined through the second planarization layer 180 in the first island pattern ISP1. The third planarization layer 181 may be formed as or defined by an organic film including or made of an acryl resin, an epoxy resin, a phenolic resin, a polyamide resin, a polyimide resin, or the like.

In such an embodiment, the first light emitting element LEL1, the first common connection electrode CCU1, the second common connection electrode CCU2, and the bank 190 illustrated in FIG. 14 may be disposed on the third planarization layer 181. In addition, a third anode connection electrode may be disposed on the second planarization layer 180, and may be connected to the second anode connection electrode through a third connection contact hole defined through the second planarization layer 180. In addition, the first pixel electrode PXE1 of the first light emitting element LEL1 may be connected to the third anode connection electrode through a fourth connection contact hole defined through the third planarization layer 181.

In an embodiment, as illustrated in FIGS. 23 and 24, the second sub-power line VSL2 and the third sub-power line VSL3 are disposed in the first island pattern ISP1, the first connection pattern CNP1, and the second connection pattern CNP2, but an embodiment of the disclosure is not limited thereto. In the first connection pattern CNP1 and the second connection pattern CNP2, the second sub-power line VSL2 and the third sub-power line VSL3 are disposed on a surface other than a neutral plane, and thus, cracks may occur in the second sub-power line VSL2 and the third sub-power line VSL3 when the first connection pattern CNP1 and the second connection pattern CNP2 are bent. Therefore, the second sub-power line VSL2 and the third sub-power line VSL3 may be disposed on the first island pattern ISP1 of which a change in length is minimized even though the display device 10 is contracted and stretched, and may not be disposed on the first connection pattern CNP1 and the second connection pattern CNP2.

In an embodiment, as illustrated in FIGS. 23 and 24, the first power line VSL includes the first sub-power line VSL1, the second sub-power line VSL2, and the third sub-power line VSL3 overlapping each other in the third direction DR3, such that an area of the first power line VSL may be increased as a compared with a length of the first power line VSL, and thus, resistance of the first power line VSL may be decreased.

In such an embodiment, a first power line VSL of the second dummy area DMA2 may be substantially the same as the first power line VSL illustrated in FIGS. 23 and 24, and thus, any repetitive detailed description of the first power line VSL of the second dummy area DMA2 will be omitted.

Figure 25:
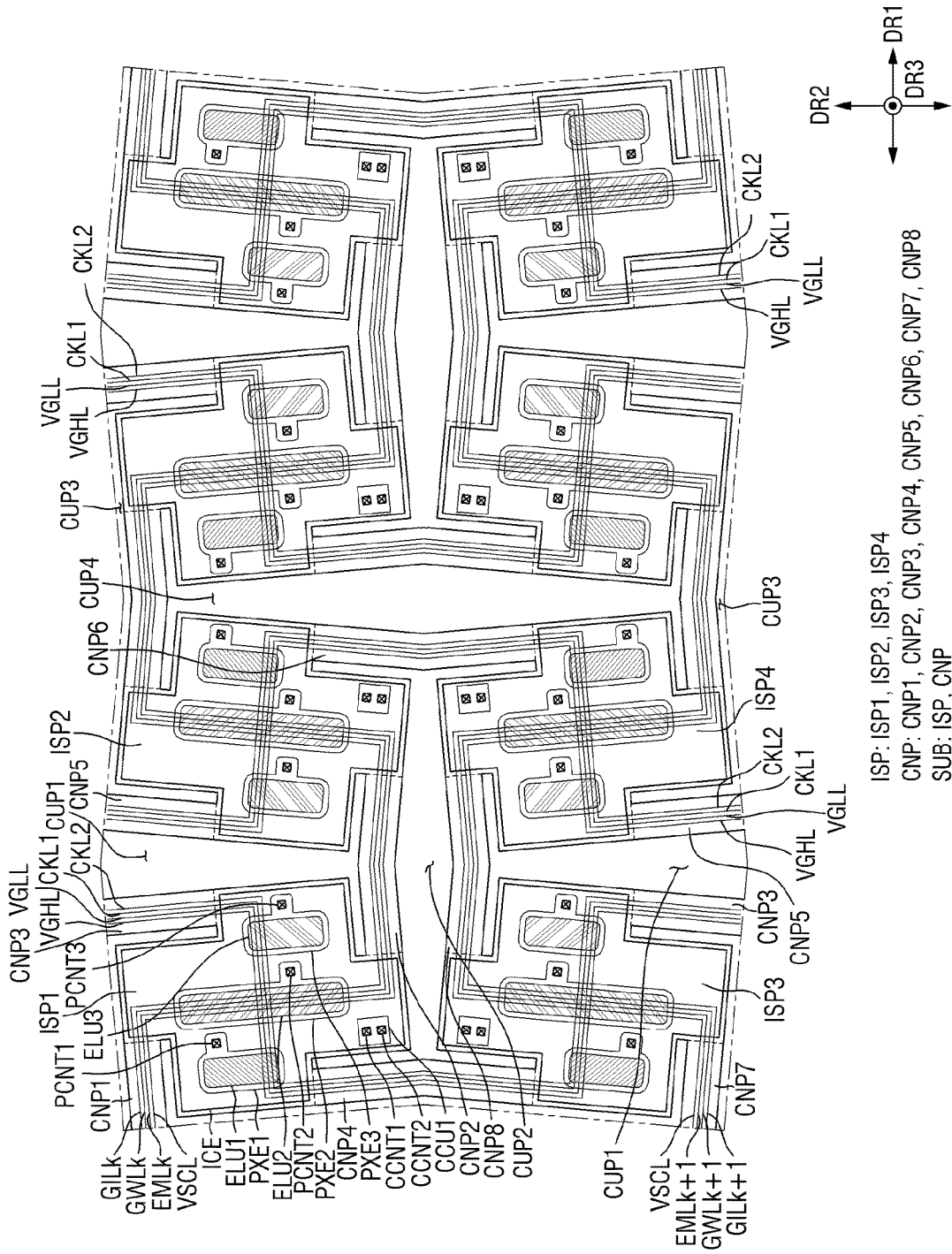
FIG. 25 is a plan view illustrating a display area according to an alternative embodiment in detail.
Figure 26:
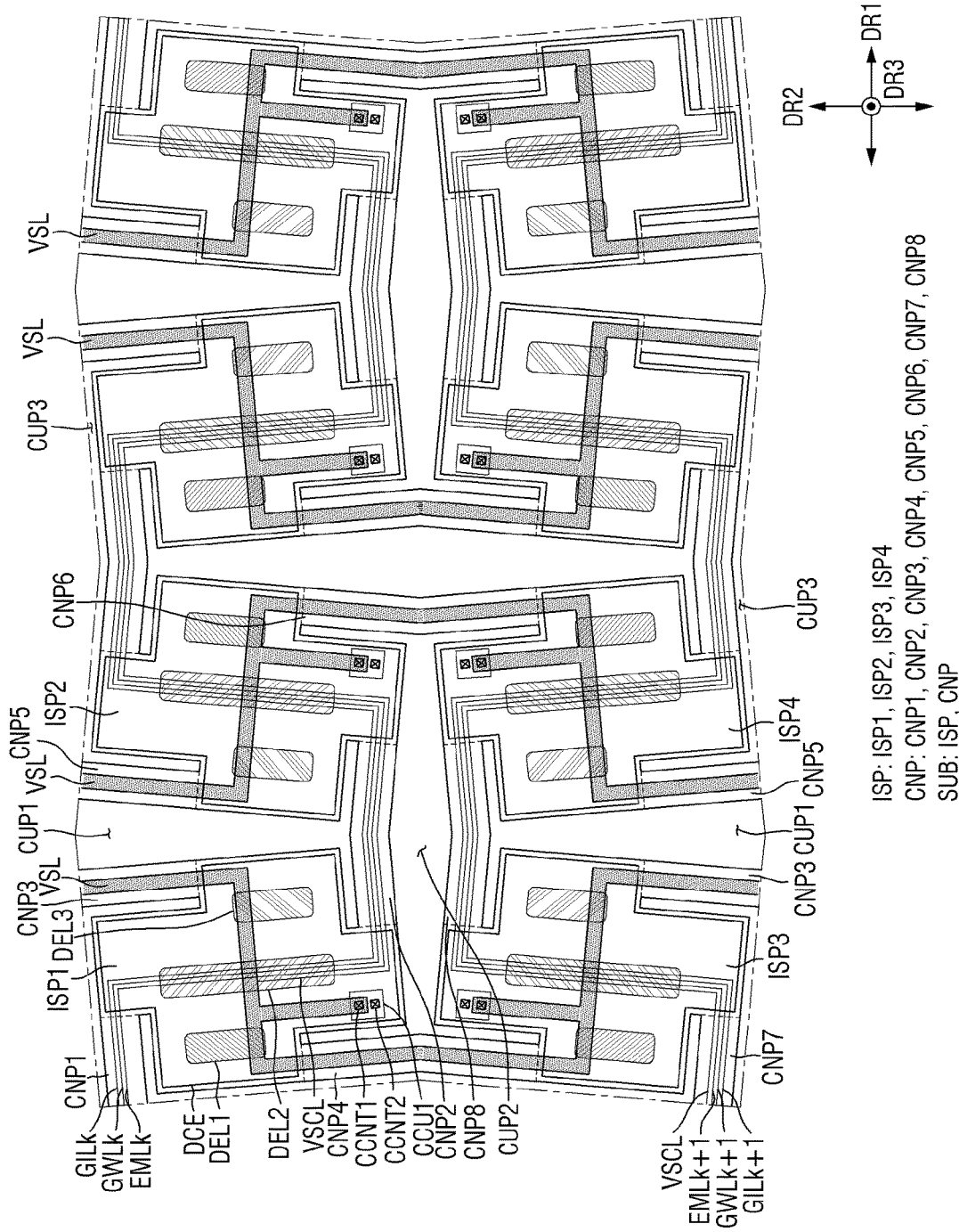
FIG. 26 is a plan view illustrating a first dummy area according to an alternative embodiment in detail.
Figure 27:
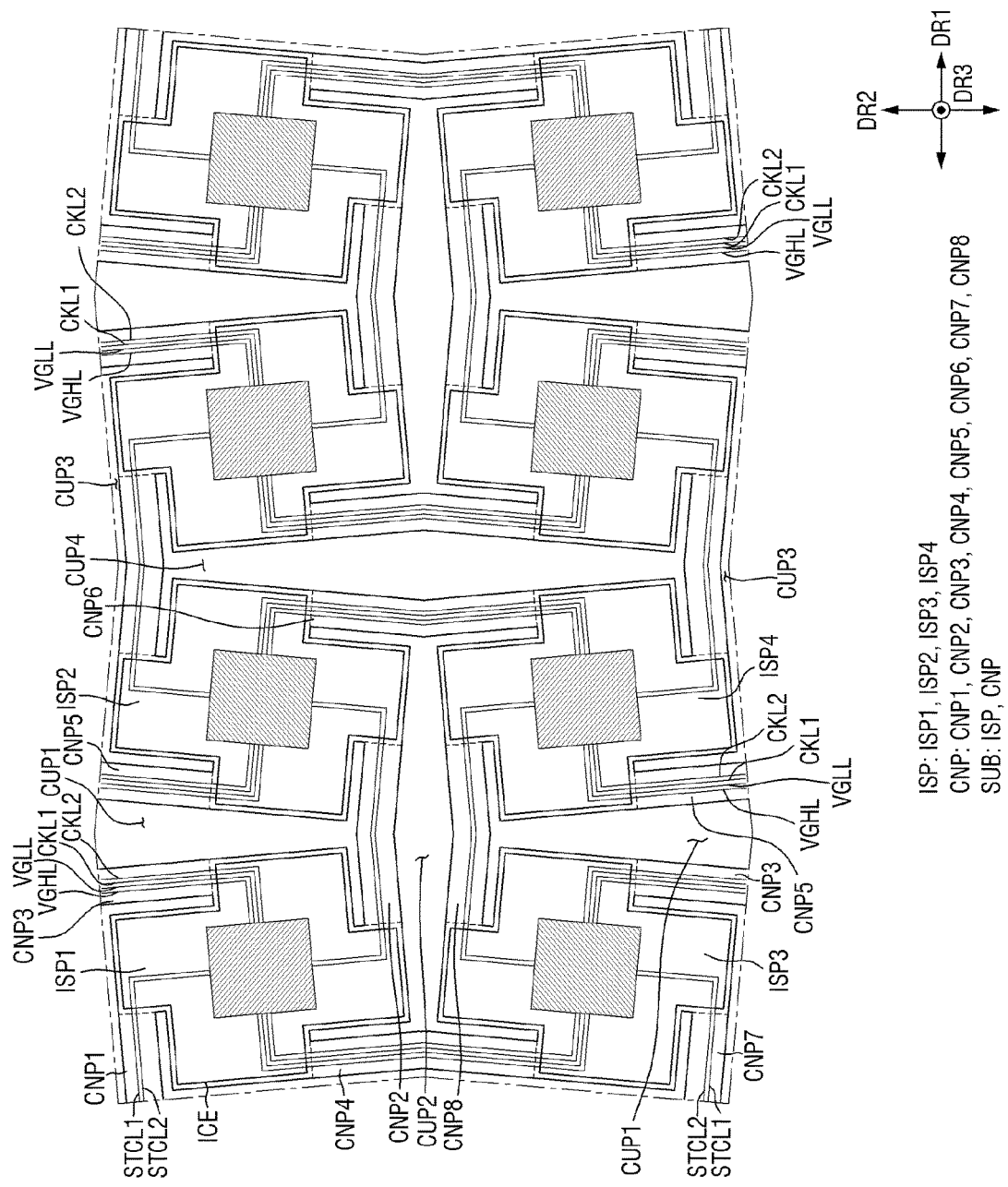
FIG. 27 is a plan view illustrating a first scan driver according to an alternative embodiment in detail.

FIG. 25 is a plan view illustrating a display area according to an alternative embodiment in detail. FIG. 26 is a plan view illustrating a first dummy area according to an alternative embodiment in detail. FIG. 27 is a plan view illustrating a first scan driver according to an alternative embodiment in detail.

In FIG. 25, island patterns ISP1 to ISP4, connection patterns CNP1 to CNP8, and cutout parts CUP1 to CUP4 of the display area DA when the display device 10 is stretched are illustrated. In FIG. 26, island patterns ISP1 to ISP4, connection patterns CNP1 to CNP8, and cutout parts CUP1 to CUP4 of the first dummy area DMA1 when the display device 10 is stretched are illustrated. In FIG. 27, island patterns ISP1 to ISP4, connection patterns CNP1 to CNP8, and cutout parts CUP1 to CUP4 of the first scan driver SDC1 when the display device 10 is stretched are illustrated.

An embodiment of FIGS. 25 to 27 is substantially the same as the embodiment of FIGS. 5, 10, and 13 except that when the display device 10 is contracted and stretched, the first to eighth connection patterns CNP1 to CNP8 are not bent or unbent, and the cutout parts CUP1 to CUP4 become wide. The same or like elements shown in FIGS. 25 to 27 have been labeled with the same reference characters as used above to describe the embodiment shown in FIGS. 5, 10, and 13, and any repetitive detailed description thereof will hereinafter be omitted or simplified.

Referring to FIGS. 25 to 27, a width of the first cutout part CUP1 in the first direction DR1 when the display device 10 is stretched may be greater than that when the display device 10 is contracted. The width of the first cutout part CUP1 when the display device 10 is stretched may become greater toward the center of the first cutout part CUP1. That is, a width of the center of the first cutout part CUP1 when the display device 10 is stretched may be greater than a width of an edge of the first cutout part CUP1.

A width of the second cutout part CUP2 in the second direction DR2 when the display device 10 is stretched may be greater than that when the display device 10 is contracted. The width of the second cutout part CUP2 when the display device 10 is stretched may become greater toward the center of the second cutout part CUP2. That is, a width of the center of the second cutout part CUP2 when the display device 10 is stretched may be greater than a width of an edge of the second cutout part CUP2.

A width of the third cutout part CUP3 in the first direction DR1 when the display device 10 is stretched may be greater than that when the display device 10 is contracted. The width of the third cutout part CUP3 when the display device 10 is stretched may become greater toward the center of the third cutout part CUP3. That is, a width of the center of the third cutout part CUP3 when the display device 10 is stretched may be greater than a width of an edge of the third cutout part CUP3.

A width of the fourth cutout part CUP4 in the first direction DR1 when the display device 10 is stretched may be greater than that when the display device 10 is contracted. The width of the fourth cutout part CUP4 when the display device 10 is stretched may become greater toward the center of the fourth cutout part CUP4. That is, a width of the center of the fourth cutout part CUP4 when the display device 10 is stretched may be greater than a width of an edge of the fourth cutout part CUP4.

Since at least portions of the thin film transistor layer TFTL are removed by a laser in the cutout parts CUP1 to CUP4, stretchability of the cutout parts CUP may be higher than that of the connection patterns CNP. Shapes of the island patterns ISP and the connection patterns CNP do not change, and the first cutout part CUP1, the second cutout part CUP2, the third cutout part CUP3, and the fourth cutout part CUP4 may become wide.

In an embodiment, as illustrated in FIGS. 25 to 27, the first to fourth island patterns ISP1 to ISP4 partitioned by the cutout parts CUP1 to CUP4 are connected to each other by the first to eighth connection patterns CNP1 to CNP8, and thus, the widths of the cutout parts CUP1 to CUP4 when the display device 10 is stretched may be greater than those when the display device 10 is contracted. Therefore, shapes of the first to fourth island patterns ISP1 to ISP4 and the first to eighth connection patterns CNP1 to CNP8 do not change and the width of each of the cutout parts CUP1 to CUP4 may be increased or decreased. Accordingly, the display area DA may be stretched and contracted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display area; and
a dummy area disposed on one side of the display area,
wherein each of the display area and the dummy area includes:
a first island pattern and a second island pattern disposed to be spaced apart from each other; and
a connection pattern connecting the first island pattern and the second island pattern to each other, and
the dummy area includes a dummy common electrode and a common connection electrode electrically connected to the dummy common electrode, which are disposed in each of the first island pattern and the second island pattern thereof.

2. The display device of claim 1, wherein the display area includes a light emitting element disposed in in each of the first island pattern and the second island pattern thereof, wherein the light emitting element includes a pixel electrode, a display emission layer disposed on the pixel electrode, and an island common electrode disposed on the display emission layer.

3. The display device of claim 2, wherein the dummy area includes a dummy emission layer disposed in each of the first island pattern and the second island pattern thereof, wherein the dummy emission layer includes a same material as the display emission layer.

4. The display device of claim 3, wherein the island common electrode is connected to the common connection electrode through a common contact hole defined through an insulating layer interposed between the island common electrode and the common connection electrode.

5. The display device of claim 4, wherein the common contact hole does not overlap the dummy emission layer.

6. The display device of claim 3, wherein the dummy area includes a first power line disposed in each of the first island pattern and the second island pattern thereof,
wherein a first power voltage is applied to the first power line, and the first power line is connected to the common connection electrode.

7. The display device of claim 6, wherein
the first power line is disposed in a same layer as the common connection electrode, and
the first power line and the common connection electrode include a same material as each other.

8. The display device of claim 7, wherein the first power line overlaps the dummy emission layer.

9. The display device of claim 6, wherein the first power line includes a first sub-power line and a second sub-power line overlapping each other.

10. The display device of claim 9, wherein
the first sub-power line is disposed in a same layer as the common connection electrode, and
the first sub-power line and the common connection electrode include a same material as each other.

11. The display device of claim 10, wherein
the first sub-power line is disposed on the first island pattern, the second island pattern, and the connection pattern in the dummy area, and
the second sub-power line is disposed on the first island pattern and the second island pattern.

12. The display device of claim 6, wherein the display area includes a pixel driver which drives the light emitting element, and
the pixel driver includes:
a driving transistor;
a first transistor which initializes a gate electrode of the driving transistor to an initialization voltage of an initialization voltage line in response to a scan initialization signal of a scan initialization line;
a second transistor which applies a data voltage to the gate electrode of the driving transistor in response to a scan write signal of a scan write line; and
a third transistor which connects a first electrode of the driving transistor to the pixel electrode in response to an emission signal of an emission line.

13. The display device of claim 12, wherein in each of the first island pattern and the second island pattern of the dummy area, the scan initialization line, the scan write line, and the emission line cross the first power line.

14. The display device of claim 13, wherein the scan initialization line, the scan write line, and the emission line overlap the dummy emission layer.

15. A display device comprising:
a display area; and
a dummy area disposed on one side of the display area,
wherein each of the display area and the dummy area includes:
a first island pattern and a second island pattern disposed to be spaced apart from each other; and
a connection pattern connecting the first island pattern and the second island pattern to each other,
the display area includes a light emitting element disposed in each of the first island pattern and the second island pattern thereof, wherein the light emitting element includes a pixel electrode, a display emission layer disposed on the pixel electrode, and an island common electrode disposed on the display emission layer,
the dummy area includes a dummy emission layer disposed in each of the first island pattern and the second island pattern thereof, wherein the dummy emission layer includes a same material as the display emission layer, and
the connection pattern is bent or unbent.

16. The display device of claim 15, wherein the dummy area includes a first power line disposed in each of the first island pattern and the second island pattern thereof, wherein a first power voltage is applied to the first power line.

17. The display device of claim 16, wherein the dummy area further includes a first power connection line connected to the first power line, and
the first power connection line includes:
a first sub-power connection line disposed on the connection pattern; and
a second sub-power connection line disposed on the first island pattern, and
the first sub-power connection line is connected to the second sub-power connection line through a first contact hole defined through an insulating layer interposed between the first sub-power connection line and the second sub-power connection line.

18. The display device of claim 17, wherein the second sub-power connection line overlaps the dummy emission layer.

19. The display device of claim 17, wherein
the first power connection line further includes a third sub-power connection line disposed on the first island pattern, and
the first sub-power connection line is connected to the third sub-power connection line through a second contact hole defined through an insulating layer interposed between the first sub-power connection line and the third sub-power connection line.

20. A display device comprising:

a display area including display pixels, a scan driver which outputs scan signals to scan lines connected to the display pixels, and a dummy area disposed between the display area and the scan driver, wherein each of the display area, the dummy area, and the scan driver includes:

a first island pattern and a second island pattern disposed to be spaced apart from each other; and a connection pattern connecting the first island pattern and the second island pattern to each other, and the scan driver includes a plurality of scan transistors disposed in each of the first island pattern and the second island pattern thereof.

* * * * *